US006969577B2

(12) United States Patent
Adegawa

(10) Patent No.: US 6,969,577 B2
(45) Date of Patent: Nov. 29, 2005

(54) POSITIVE RESIST COMPOSITION

(75) Inventor: Yutaka Adegawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 30 days.

(21) Appl. No.: 10/792,306

(22) Filed: Mar. 4, 2004

(65) Prior Publication Data

US 2004/0180288 A1 Sep. 16, 2004

(30) Foreign Application Priority Data

Mar. 4, 2003 (JP) .................................... P. 2003-057343

(51) Int. Cl.[7] ............................ G03F 7/004; G03F 7/30

(52) U.S. Cl. .................... 430/270.1; 430/905; 430/910; 430/326

(58) Field of Search ............................. 430/270.1, 905, 430/910, 326

(56) References Cited

U.S. PATENT DOCUMENTS 5,856,071 A 1/1999 Kotachi et al.
6,565,763 B1 * 5/2003 Asakawa et al. ............. 216/56
6,632,582 B2 * 10/2003 Kishimura et al. ...... 430/270.1
6,830,870 B2 * 12/2004 Malik et al. ............. 430/270.1

FOREIGN PATENT DOCUMENTS

JP 7-99435 B2 10/1995
JP 2002-256033 A 9/2002
JP 2001-305737 A 11/2002
WO WO 02/073308 A1 9/2002

OTHER PUBLICATIONS

Machine translation of JP 2002–256033.*

* cited by examiner

*Primary Examiner*—Yvette C. Thornton
(74) *Attorney, Agent, or Firm*—Sughrue Mion, PLLC

(57) ABSTRACT

A positive resist composition comprising (A) a resin having a specific structure and capable of decomposing under action of an acid to increase solubility in an alkali developer, and (B) a compound capable of generating an acid upon irradiation with an actinic ray or radiation.

16 Claims, 1 Drawing Sheet

POSITIVE RESIST COMPOSITION

FIELD OF THE INVENTION

The present invention relates to a positive resist composition suitable for exposure to radiant rays, such as ultraviolet rays, far ultraviolet rays, X-rays, electron beams, molecular beams, γ-rays and synchrotron radiation.

The present positive resist composition can be used in a process as described below. Specifically, on a substrate, such as semiconductor wafer, glass, ceramic or metal, or on an antireflection layer or an organic film provided on such a substrate, the present positive resist composition is coated in a thickness of 0.01 to 3 μm in accordance with a spin coating method or a roller coating method. Thereafter, the coating of the composition is heated and dried. And circuit patterns are printed thereon via an exposure mask by irradiation with an actinic ray, and then developed. Thus, positive images are obtained. Further, the substrate is etched by using those positive images as a mask to result in patterning thereof. In the typical field of application, the process of producing semiconductors, such as ICs, the process of producing circuit boards for liquid crystal displays and thermal heads, and other photofabrication processes are included.

BACKGROUND OF THE INVENTION

Recent increase in packing densities of LSI circuits has revealed limitations of resolutions to which traditional resists of monolayer type can reach. So a method of making a resist have a multilayer structure, and not a single layer structure, and forming fine patterns which have great coating thickness, and profiles of high aspect ratios besides, has been proposed. More specifically, a thick coating of organic high polymer is formed as the first layer, and thereon a thin resist material layer is formed as the second layer. Thereafter, the resist material of the second layer is irradiated with high-energy beams, and then developed. By using the thus obtained patterns as a mask, the organic high polymer of the first layer is etched anisotropically by oxygen plasma etching ($O_2$-RIE) to form patterns whose profiles are highly rectangular (See Lin, *Solid State Technology*, vol. 24, p. 73 (1981)).

This double-layer resist method has an advantage that the second resist layer can be reduced in thickness, and thereby enabling achievement of a high resolution, a high aspect ratio and a great focus depth.

In this case, the second resist layer is required to have high resistance to $O_2$-RIE, so that silicon-containing polymers are generally used for the second resist layer. Many attempts to use vinyl polymers having in their side chains silicon-containing acid-decomposable groups have been made, especially on the grounds that such vinyl polymers can ensure a high degree of freedom in molecular design, starting materials thereof can be easily available and they can be synthesized with ease. For instance, they are disclosed in Patent Document 1 (JP-B-7-99435), Patent Document 2 (U.S. Pat. No. 5,856,071), Patent Document 3 (WO 02/73308A1), Patent Document 4 (JP-A-2001-305737) and Patent Document 5 (JP-A-2002-256033)

Although those double-layer resist methods were applied with the intention of, e.g., forming fine patterns in the vicinity of limiting resolution of 0.14 μm or below by use of ArF laser as exposure light source, they were unable to deliver satisfactory resist performances, including high resolution, good mask linearity of critical dimension (CD), scum free, reduction in thinning of resist film and reduction in SEM shrink (shrink occurring at the time of observation under a scanning electron microscope).

[Patent Document 1] JP-B-7-99435
[Patent Document 2] U.S. Pat. No. 5,856,071
[Patent Document 3] WO 02/73308A1
[Patent Document 4] JP-A-2001-305737
[Patent Document 5] JP-A-2002-256033

SUMMARY OF THE INVENTION

An object of the invention is to provide a positive resist composition which is adaptable for exposure to far ultraviolet radiation using ArF and KrF as light sources in the process of manufacturing semiconductor devices and has various performance improvements, including heightened resolution, excellent mask linearity of CD, scum free, reduced thinning of resist film and reduced SEM shrink.

As a result of heeding the foregoing characteristics and studying intensively, the invention comes to be achieved. More specifically, the aforesaid object can be attained with the following embodiments of the invention.

(1) A positive resist composition comprising:

(A) a resin capable of decomposing under action of an acid and increasing solubility in an alkali developer, and (B) a compound capable of generating an acid upon irradiation with an actinic ray or radiation, wherein the component (A) has repeating units of at least one kind selected from the group consisting of vinyl ether repeating units containing groups represented by the following formula (A), vinyl ester repeating units containing groups represented by the following formula (A) and β-alkylacrylic acid repeating units containing groups represented by the following formula (A):

(A)

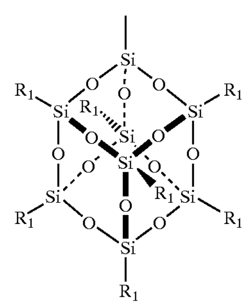

wherein each of $R_1$s individually represents a substituted or unsubstituted straight-chain, branched or cyclic alkyl group, and a plurality of $R_1$s may be the same or different.

(2) The composition according to the above (1), wherein the vinyl ether repeating units are repeating units represented by the following formula (VA-1), (VA-2) or (VA-3):

(VA-1)

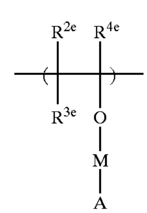

-continued (VA-2)

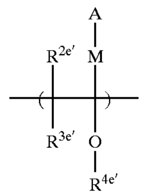

(VA-3)

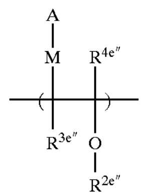

wherein $R^{2e}$, $R^{3e}$, $R^{2e'}$, $R^{3e'}$ and $R^{3e''}$ independently represent a hydrogen atom, an alkyl group or an alkoxy group, with the provided that both $R^{2e}$ and $R^{3e}$ do not represent alkoxy groups at the same time, and that both $R^{2e'}$ and $R^{3e'}$ do not represent alkoxy groups at the same time, $R^{4e'}$ and $R^{2e''}$ independently represent an alkyl group, $R^{4e}$ and $R^{4e''}$ independently represent a hydrogen atom or an alkyl group, M represents a divalent linkage group, and A is a group represented by formula (A), part of M and $R^{3e}$, $R^{2e}$ and $R^{4e}$, part of M and $R^{2e'}$, $R^{3e'}$ and $R^{4e'}$, part of M and $R^{4e''}$, or $R^{3e''}$ and $R^{2e''}$ may be combined with each other to form a ring.

(3) The composition according to the above (1), wherein the vinyl ester repeating units are repeating units represented by the following formula (VB-1), (VB-2) or (VB-3):

(VB-1)

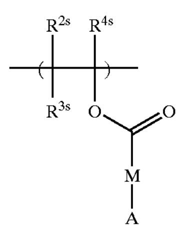

(VB-2)

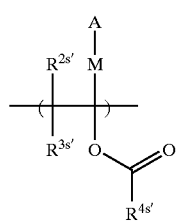

(VB-3)

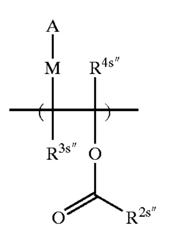

wherein $R^{2s}$, $R^{3s}$, $R^{4s}$, $R^{2s'}$, $R^{3s'}$, $R^{3s''}$ and $R^{4s''}$ independently represent a hydrogen atom or an alkyl group, $R^{4s'}$ and $R^{2s''}$ independently represent an alkyl group, M represents a divalent linkage group, and A is a group represented by formula (A), part of M and $R^{3s}$, $R^{2s}$ and $R^{4s}$, part of M and $R^{2s'}$, $R^{3s'}$ and $R^{4s'}$, part of M and $R^{4s''}$, or $R^{3s''}$ and $R^{2s''}$ may be combined with each other to form a ring.

(4) The composition according to the above (1), wherein the β-alkylacrylic acid repeating units are repeating units represented by the following formula (AA-1), (AA-2) or (AA-3):

(AA-1)

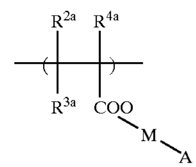

(AA-2)

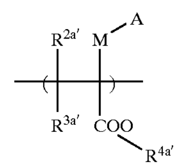

(AA-3)

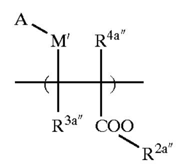

wherein $R^{2a}$, $R^{2a'}$, $R^{4a'}$ and $R^{2a''}$ independently represent an alkyl group, $R^{3a}$, $R^{4a}$, $R^{3a'}$, $R^{3a''}$ and $R^{4a''}$ independently represent a hydrogen atom or an alkyl group, M represents a divalent linkage group, M' represents a divalent linkage group attaching to the main chain via a carbon atom or a silicon atom, and A is a group represented by formula (A), wherein part of M and $R^{3a}$, $R^{2a}$ and $R^{4a}$, part of M and $R^{2a'}$, $R^{3a'}$ and $R^{4a'}$, part of M' and $R^{4a''}$, or $R^{3a''}$ and $R^{2a''}$ may be combined with each other to form a ring.

(5) The composition according to the above (1), wherein the component (A) further comprises repeating units containing hydrophilic functional groups.

(6) The composition according to the above (1), wherein the component (A) further comprises repeating units of at least one kind selected from repeating units represented by the following formula (2a) or repeating units represented by the following formula (2b):

(2a)

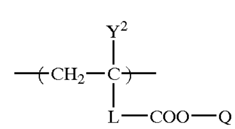

wherein $Y^2$ represents a hydrogen atom, an alkyl group, a cyano group or a halogen atom, L represents a single bond or a divalent linkage group, and Q represents a group decomposing by an acid and generating a carboxylic acid:

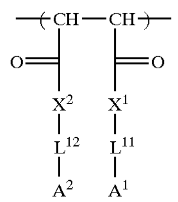
(2b)

wherein $X^1$ and $X^2$ independently represent an oxygen atom, a sulfur atom, —NH— or —$NHSO_2$—, $L^{11}$ and $L^{12}$ independently represent a single bond or a divalent linkage group, $A^1$ and $A^2$ independently represent a hydrogen atom, a cyano group, a hydroxyl group, —COOH, —COOR $^{5c}$, —CO—NH—$R^{6c}$, an unsubstituted or substituted alkyl group, an alkoxy group or —COOQ, $R^{5c}$ and $R^{6c}$ each represents an unsubstituted or substituted alkyl group, and Q represents a group capable of decomposing by acid and generating a carboxylic acid.

(7) The composition according to the above (1), further comprising (C) at least one kind of surfactant selected from fluorine-based and/or silicon-based surfactants or nonionic surfactants.

(8) The composition according to the above (1), further comprising (D) an organic basic compound.

(9) The composition according to the above (1), wherein the proportion of the repeating units having groups represented by formula (A) is from 3 to 90 mole % based on the total amount of the resin (A).

(10) The composition according to the above (9), wherein the proportion of the repeating units having groups represented by formula (A) is from 5 to 70 mole % based on the total amount of the resin (A).

(11) The composition according to the above (10), wherein the proportion of the repeating units having groups represented by formula (A) is from 10 to 60 mole % based on the total amount of the resin (A).

(12) The composition according to the above (5), wherein the proportion of the repeating units having hydrophilic functional groups is from 1 to 70 mole % based on the total amount of the resin (A).

(13) The composition according to the above (12), wherein the proportion of the repeating units having hydrophilic functional groups is from 5 to 60 mole % based on the total amount of the resin (A).

(14) The composition according to the above (13), wherein the proportion of the repeating units having hydrophilic functional groups is from 10 to 50 mole % based on the total amount of the resin (A).

(15) The composition according to the above (6), wherein the proportion of the repeating units of at least one kind selected from repeating units represented by the following formula (2a) or repeating units represented by the following formula (2b) is 5 to 50 mole % based on the total amount of the resin (A).

(16) A method for forming a pattern, which comprises forming a resist film comprising the composition described in the above (1), exposing the resist film upon irradiation with the actinic ray or a radiation, and subsequently developing the resist film.

DETAILED DESCRIPTION OF THE INVENTION

Figure 1:
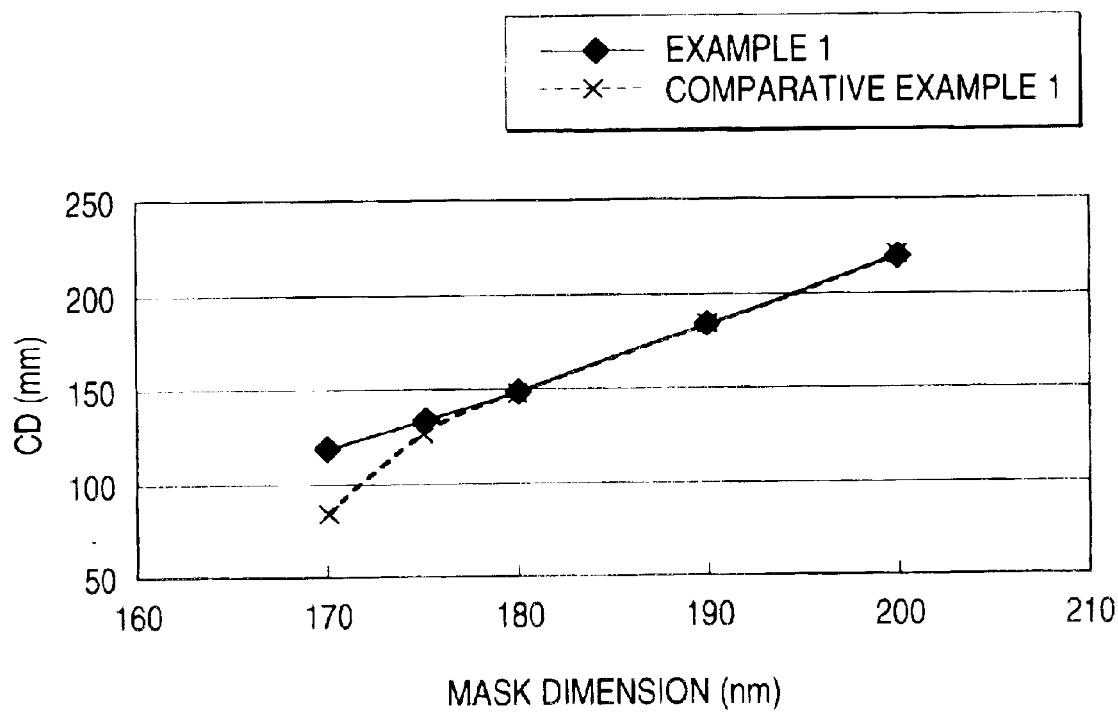
FIG. 1 is a graph showing evaluation results of the mask linearity examinations done on the positive resist compositions prepared in Example 1 and Comparative Example 1, respectively.

Modes for carrying out the invention are illustrated below. However, the invention should not be construed as being limited to these modes.

(A) Resin having repeating units of at least one kind selected from the group consisting of vinyl ether repeating units containing groups represented by the following formula (A), vinyl ester repeating units containing groups represented by the following formula (A) and β-alkylacrylic acid repeating units containing groups represented by the following formula (A), and capable of decomposing under action of an acid and increasing solubility in an alkali developer:

The present positive resist composition comprises a resin having repeating units of at least one kind selected from the group consisting of vinyl ether repeating units containing groups represented by the following formula (A), vinyl ester repeating units containing groups represented by the following formula (A) and β-alkylacrylic acid repeating units containing groups represented by the following formula (A), and capable of decomposing under action of an acid and increasing solubility in an alkali developer (referred to as "acid-decomposable resin", too).

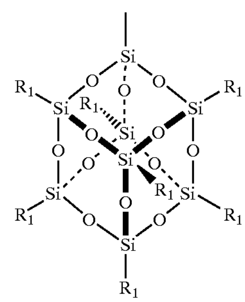
(A)

In formula (A), each $R_1$ represents an unsubstituted or substituted, straight-chain, branched or cyclic alkyl group, and a plurality of $R_1$s may be same or different.

As the straight-chain, branched or cyclic alkyl group represented by each $R_1$, straight-chain alkyl groups having 1 to 5 carbon atoms (hereinafter referred to as 1–5C), 3–5C branched alkyl groups or 3–5C cycloalkyl groups are suitable, respectively. Examples of those groups include a methyl group, an ethyl group, an isopropyl group, a cyclopropyl group and cyclobutyl group.

$R_1$ may not have a substituent, or may have a substituent.

Examples of a substituent $R_1$ may have include a hydroxyl group, a cyano group, a group containing an ester moiety, a group containing an ether moiety, a group containing a sulfone moiety and a group containing sulfonyloxy moiety.

At least one of the $R_1$s is preferably substituted with a hydroxyl group, a cyano group, a group containing an ester moiety, a group containing an ether moiety, a group containing a sulfone moiety or a group containing sulfonyloxy moiety.

It is far preferable that at least three of the $R_1$s are substituted with a hydroxyl group, a cyano group, a group containing an ester moiety, a group containing an ether moiety, a group containing a sulfone moiety or a group containing sulfonyloxy moiety.

Examples of such an ester moiety include a methoxycarbonyl group, an ethoxycarbonyl group, a methylcarbonyloxy group and an ethoxycarbonyloxy group.

Examples of such an ether moiety include a methyl ether group and an ethyl ether group.

Examples of such a sulfone moiety include a methylsulfonyl group and an ethylsulfonyl group.

Examples of such a sulfonyloxy group include a methyloxysulfonyl group and an ethyloxysulfonyl group.

The straight-chain, branched and cyclic alkyl groups represented by $R_1$s are groups containing neither carbon-carbon multiple bonding nor aromatic ring in their respective substituents.

Examples of a group represented by formula (A) are illustrated below, but these examples should not be construed as limiting the scope of the invention in any way.

(A1)

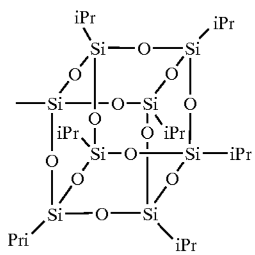

(A2)

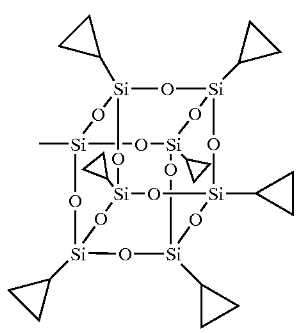

(A3)

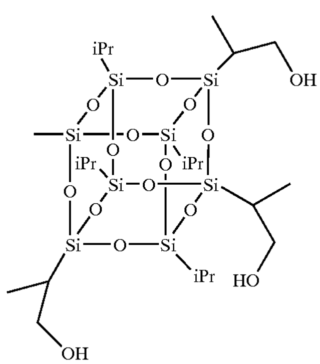

(A4)

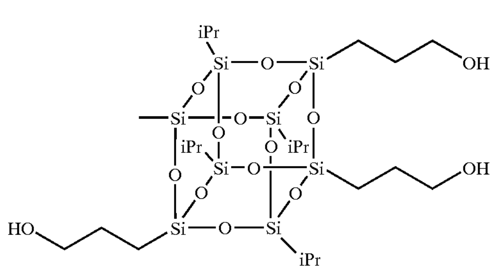

-continued (A5)

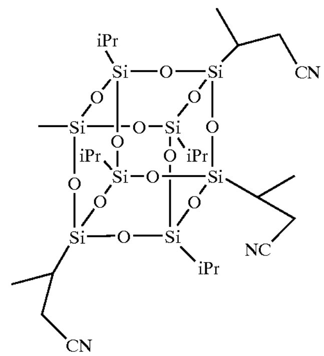

(A6)

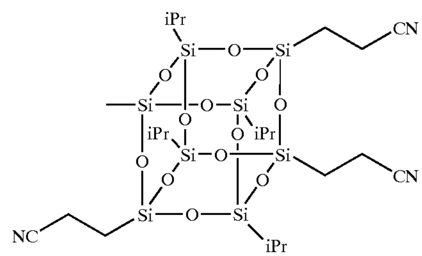

(A7)

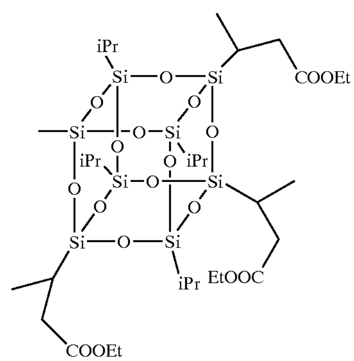

(A8)

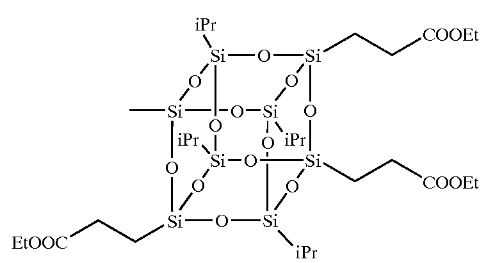

(A9)

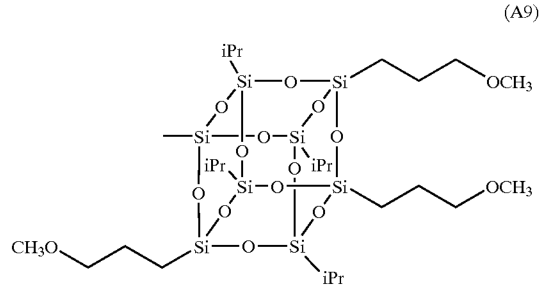

-continued (A10)

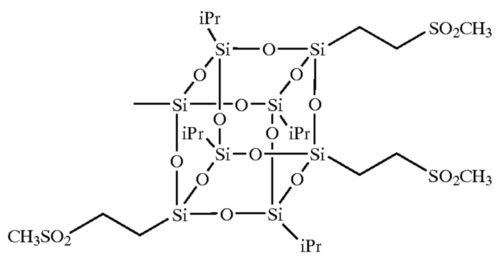

(A11)

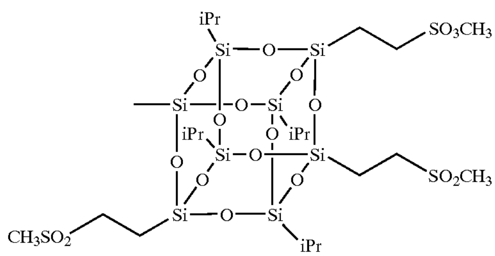

As examples of vinyl ether repeating units having the groups represented by formula (A), repeating units represented by the following formula (VA-1), (VA-2) or (VA-3) are suitable.

(VA-1)

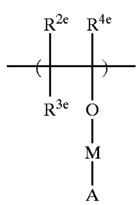

(VA-2)

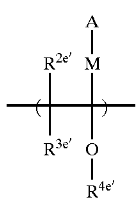

(VA-3)

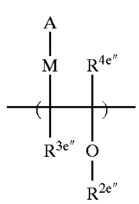

In formulae (VA-1) to (VA-3), $R^{2e}$, $R^{3e}$, $R^{2e'}$, $R^{3e'}$ and $R^{3e''}$ independently represent a hydrogen atom, an alkyl group or an alkoxy group, with the provided that both $R^{2e}$ and $R^{3e}$ do not represent alkoxy groups at the same time, and that both $R^{2e'}$ and $R^{3e'}$ do not represent alkoxy groups at the same time, $R^{4e'}$ and $R^{2e''}$ independently represent an alkyl group, $R^{4e}$ and $R^{4e''}$ independently represent a hydrogen atom or an alkyl group, M represents a divalent linkage group, and A is a group represented by formula (A), part of M and $R^{3e}$, $R^{2e}$ and $R^{4e}$, part of M and $R^{2e'}$, $R^{3e'}$ and $R^{4e'}$, part of M and $R^{4e''}$, or $R^{3e''}$ and $R^{2e''}$ may be combined with each other to form a ring.

Alkyl groups suitable for $R^{2e}$ to $R^{4e''}$ are straight-chain, branched or cyclic alkyl groups having 1 to 4 carbon atoms, and the examples thereof include a methyl group, an ethyl group, a propyl group, an n-butyl group, a sec-butyl group, a t-butyl group, a cyclopropyl group and a cyclobutyl group. These alkyl groups may have substituents such as halogen atoms or cyano groups.

Alkoxy groups suitable for $R^{2e}$, $R^{3e}$, $R^{2e'}$, $R^{3e'}$ and $R^{3e''}$ are alkoxy groups having 1 to 4 carbon atoms, and the examples thereof include a methoxy group, an ethoxy group, a propoxy group, an n-butoxy group, an isobutoxy group, a sec-butoxy group and a t-butoxy group. These alkoxy groups may have substituents such as halogen atoms or cyano groups.

Divalent linkage groups suitable for M are divalent linkage groups having 1 to 8 carbon atoms, with examples including alkylene groups, such as a methylene group, anethylene group, a propylene group and butylene group. Such divalent linkage groups may contain silicon atoms.

Examples of a ring formed by combining part of M with $R^{3e}$, $R^{2e}$ with $R^{4e}$, part of M with $R^{2e'}$, $R^{3e'}$ with $R^{4e'}$, part of M with $R^{4e''}$, or $R^{3e''}$ with $R^{2e''}$ include rings having 4 to 8 carbon atoms, which may contain oxy groups as their respective ring members.

Examples of the vinyl ether repeating units having groups represented by formula (A) are illustrated below, but these examples should not be construed as limiting the scope of the invention in any way.

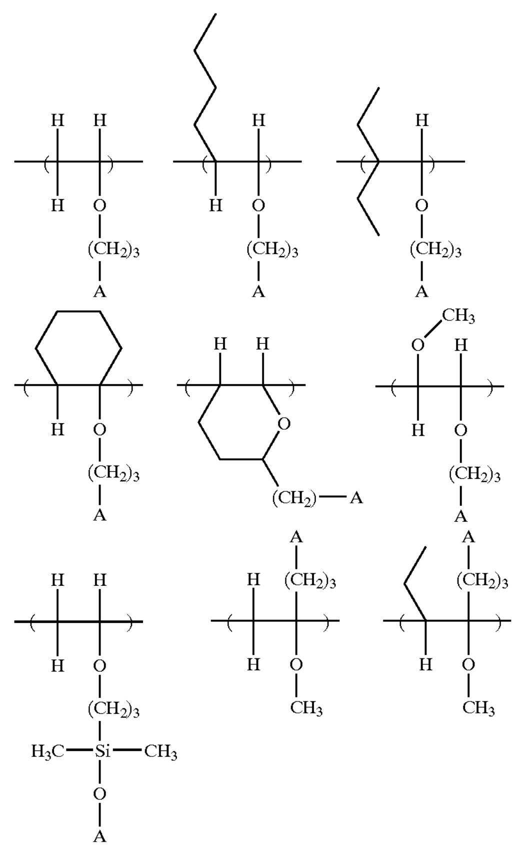

-continued

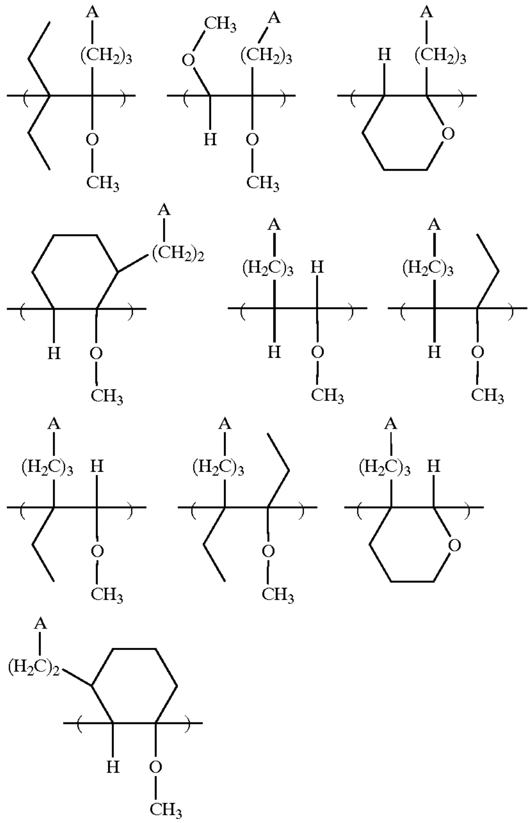

As examples of vinyl ester repeating units having the groups represented by formula (A), repeating units represented by the following formula (VB-1), (VB-2) or (VB-3) are suitable.

(VB-1)

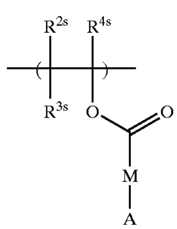

(VB-2)

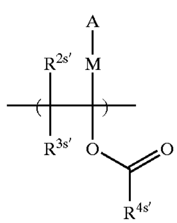

(VB-3)

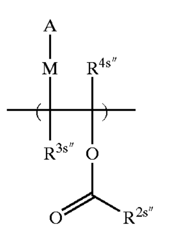

In formulae (VB-1) to (VB-3), $R^{2s}$, $R^{3s}$, $R^{4s}$, $R^{2s'}$, $R^{3s'}$, $R^{3s''}$ and $R^{4s''}$ independently represent a hydrogen atom or an alkyl group, $R^{4s'}$ and $R^{2s''}$ independently represent an alkyl group, M represents a divalent linkage group, and A is a group represented by formula (A), part of M and $R^{3s}$, $R^{2s}$ and $R^{4s}$, part of M and $R^{2s'}$, $R^{3s'}$ and $R^{4s'}$, part of M and $R^{4s''}$, or $R^{3s''}$ and $R^{2s''}$ may be combined with each other to form a ring.

Examples of alkyl groups represented by $R^{2s}$ to $R^{4s''}$ include the same ones as included in examples of an alkyl group represented by $R^{2e}$ in formula (VA-1).

Examples of a divalent linkage group represented by M include the same ones as included in examples of a divalent linkage group represented by M in formula (VA-1).

Examples of a ring formed by combining part of M with $R^{3s}$, $R^{2s}$ with $R^{4s}$, part of M with $R^{2s'}$, $R^{3s'}$ with $R^{4s'}$, part of M with $R^{4s''}$, or $R^{3s''}$ with $R^{2s''}$ include rings having 4 to 8 carbon atoms, which may contain oxy groups as their respective ring members.

Examples of vinyl ester repeating units having the groups represented by formula (A) are illustrated below, but these examples should not be construed as limiting the scope of the invention in any way.

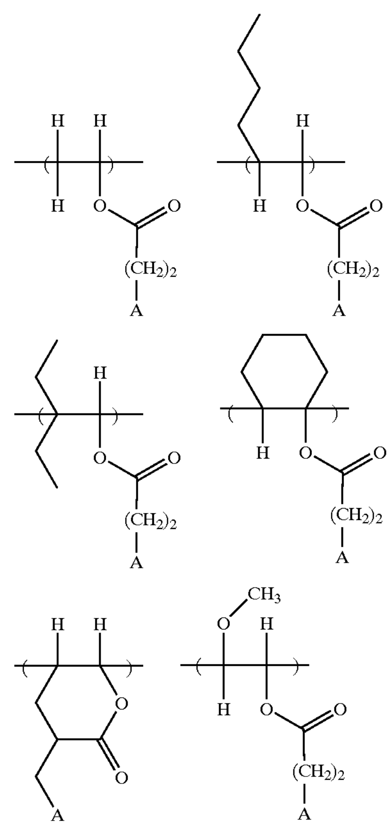

-continued

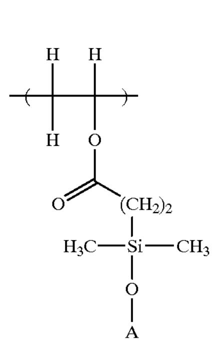

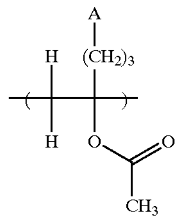

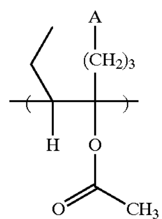

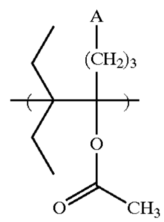

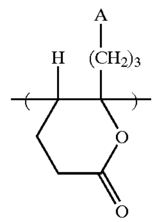

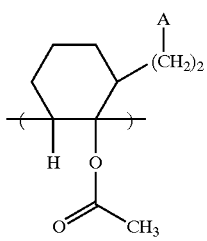

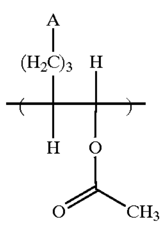

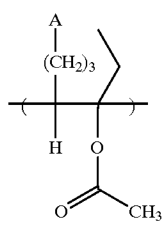

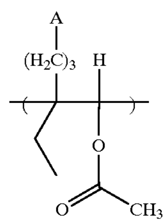

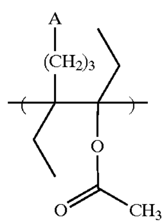

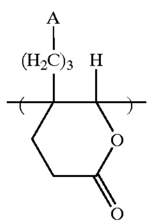

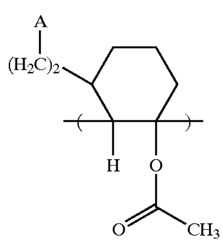

As examples of β-alkylacrylic acid repeating units having the groups represented by formula (A), repeating units represented by the following formula (AA-1), (AA-2) or (AA-3) are suitable.

(AA-1)

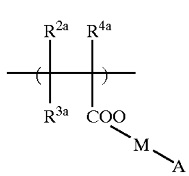

-continued (AA-2)

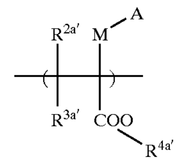

(AA-3)

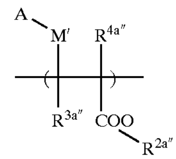

In formulae (AA-1) to (AA-3), $R^{2a}$, $R^{2a'}$, $R^{4a'}$ and $R^{2a''}$ independently represent an alkyl group, $R^{3a}$, $R^{4a}$, $R^{3a'}$, $R^{3a''}$ and $R^{4a''}$ independently represent a hydrogen atom or an alkyl group, M represents a divalent linkage group, M' represents a divalent linkage group attaching to the main chain via a carbon atom or a silicon atom, and A is a group represented by formula (A), wherein part of M and $R^{3a}$, $R^{2a}$ and $R^{4a}$, part of M and $R^{2a'}$, $R^{3a'}$ and $R^{4a'}$, part of M' and $R^{4a''}$, or $R^{3a''}$ and $R^{2a''}$ may be combined with each other to form a ring.

Examples of alkyl groups represented by $R^{2a}$ to $R^{4a''}$ include the same ones as included in examples of an alkyl group represented by $R^{2e}$ in formula (VA-1).

Examples of divalent linkage groups represented by M and M' include the same ones as included in examples of a divalent linkage group represented by M in formula (VA-1).

Examples of a ring formed by combining part of M with $R^{3a}$, $R^{2a}$ with $R^{4a}$, part of M with $R^{2a'}$, $R^{3a'}$ with $R^{4a'}$, part of M' with $R^{4a''}$, or $R^{3a''}$ with $R^{2a''}$ include rings having 4 to 8 carbon atoms, which may contain oxy groups or carbonyl-group carbons as their respective ring members.

Examples of β-alkylacrylic acid repeating units having the groups represented by formula (A) are illustrated below, but these examples should not be construed as limiting the scope of the invention in any way.

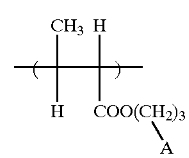

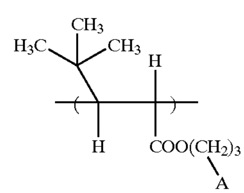

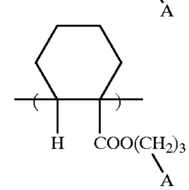

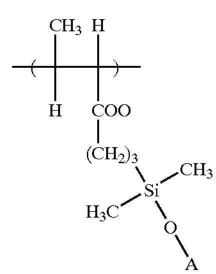

-continued

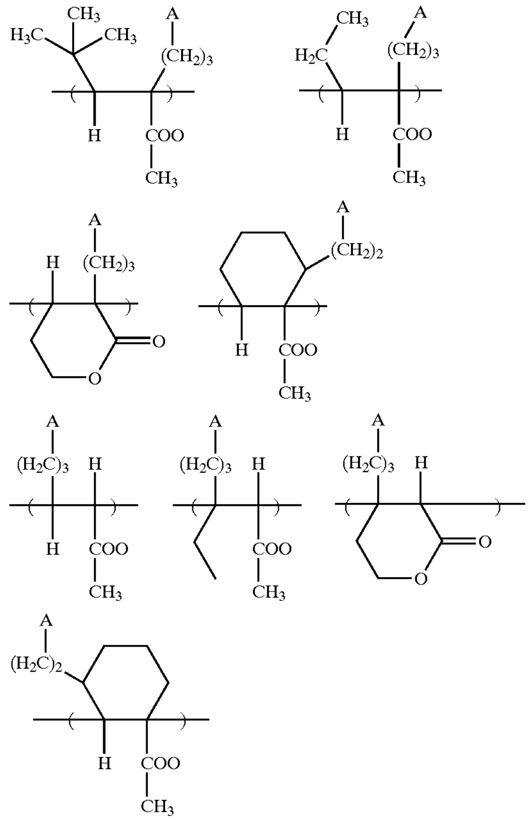

It is preferable that the acid-decomposable resin further comprises repeating units having hydrophilic functional groups.

Examples of such hydrophilic functional groups include a carboxyl group, a carboxylic acid anhydride group, a lactone group, a hydroxyl group, an ester group, an ether group, a cyano (nitrile) group, a sulfonyl group and sulfonic acid group.

Examples of a monomer forming repeating units having hydrophilic functional groups include the following monomers.

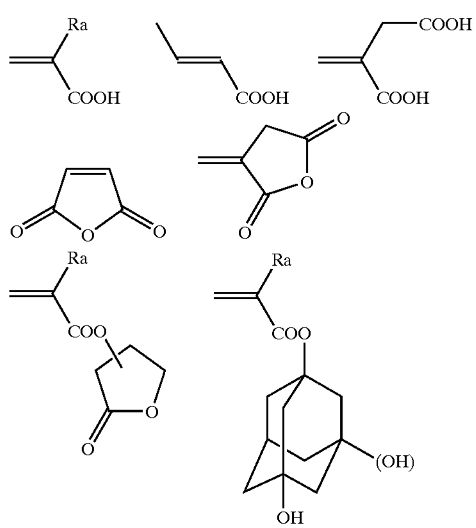

-continued

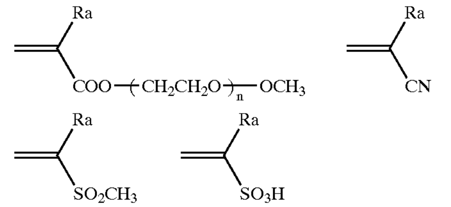

n = integer of 1 or more

In the above structural formulae, Ra represents a hydrogen atom or a methyl group.

The repeating units having hydrophilic functional groups may be formed from the hydrophilic functional group-containing monomer as illustrated above, or by polymerizing monomers to form a resin and then introducing hydrophilic functional groups into the resin by reacting a certain compound with specific repeating units in the resin.

It is also preferable that the acid-decomposable resin further contains repeating units of at least one kind chosen from repeating units represented by the following formula (2a) or repeating units represented by the following formula (2b).

(2a)

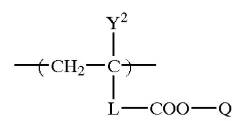

In formula (2a), $Y^2$ is a hydrogen atom, an alkyl group, a cyano group or a halogen atom (e.g., Cl, Br, I), preferably a hydrogen atom or an alkyl group having 1 to 3 carbon atoms, particularly preferably a hydrogen atom or a methyl group.

L represents a single bond or a divalent linkage group, with examples including unsubstituted and substituted alkylene groups. Such alkylene groups are preferably those represented by the following formula:

$$—[(Ra)(Rb)]_r—$$

wherein Ra and Rb each represents a hydrogen atom, an unsubstituted or substituted alkyl group, a halogen atom, a hydroxyl group or an alkoxy group, and they may be the same or different. As the alkyl group, lower alkyl groups, such as a methyl group, an ethyl group, a propyl group, an isopropyl group and a butyl group, are suitable. A favorable choice from these groups is a methyl group, an ethyl group, a propyl group or an isopropyl group.

The substituent of a substituted alkyl group includes a hydroxyl group, a halogen atom and an alkoxy group. Examples of an alkoxy group as mentioned above include 1–4C alkoxy groups, such as a methoxy group, an ethoxy group, a propoxy group and a butoxy group. Examples of a halogen atom represented by Ra and Rb each include a chlorine atom, a bromine atom, a fluorine atom and an iodine atom. r represents an integer of 1 to 10.

Q represents a group capable of decomposing by an acid and generating carboxylic acid (hereinafter referred to as "acid-decomposable group", too).

Examples of Q include tertiary alkyl groups, such as a t-butyl group and a t-amyl group; 1-alkoxyethyl groups, such as an isobornyl group, a 1-ethoxyethyl group, a 1-butoxyethyl group, a 1-isobutoxyethyl group and a 1-cyclohexyloxyethyl; alkoxymethyl groups, such as a 1-methoxymethyl group and a 1-ethoxymethyl group; and a tetrahydropyranyl group, a tetrahydrofurfuryl group, a 3-oxycyclohexyl group, a 2-methyl-adamantyl group, a mevalonic lactone residue and a 2-(γ-butyrolactonyloxycarbonyl)-2-propyl group.

Examples of repeating units represented by formula (2a) are illustrated below, but these examples should not be construed as limiting the scope of the invention.

(2a-1)

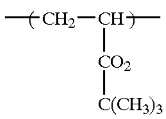

(2a-2)

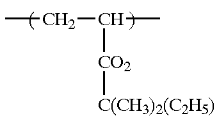

(2a-3)

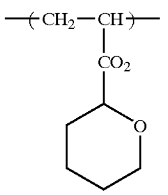

(2a-4)

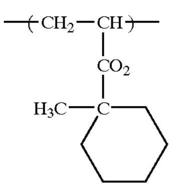

(2a-5)

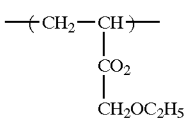

(2a-6)

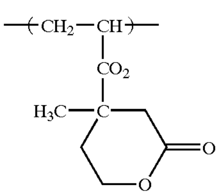

(2a-7)

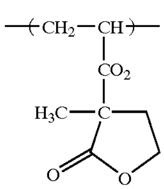

(2a-8)

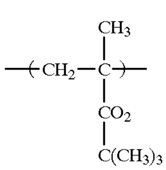

(2a-9)

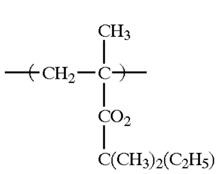

-continued (2a-10)

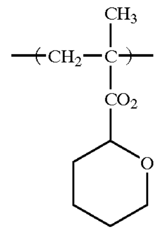

(2a-11)

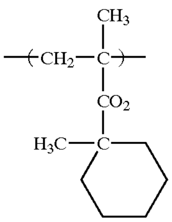

(2a-12)

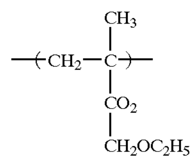

(2a-13)

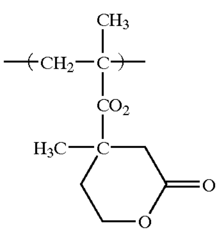

(2a-14)

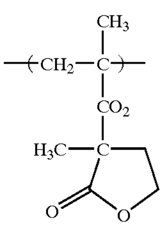

(2b)

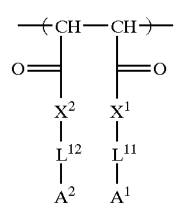

In formula (2b), $X^1$ and $X^2$ independently represent a radical selected from —O—, —S— or —$NHSO_2$—. $L^{11}$ and $L^{12}$ independently represent a single bond or a divalent linkage group.

Examples of a divalent linkage group represented by $L^{11}$ and $L^{12}$ each includes unsubstituted and substituted alkylene groups, an ether group, a thioether group, a carbonyl group, an ester group, a sulfonamido group and combinations of two or more of the groups recited above.

Examples of unsubstituted and substituted alkylene groups represented by $L^{11}$ and $L^{12}$ each includes the same groups as included in examples of those represented by L in formula (2a).

In formula (2b), $A^1$ and $A^2$ independently represent a hydrogen atom, a cyano group, a hydroxyl group, —COOH, —COOR$^{5c}$, an alkyl group which may be substituted, an alkoxy group, or —COOQ. Herein, R$^{5c}$ represents an alkyl group which may be substituted.

Suitable examples of an alkyl group represented by A$^1$, A$^2$ and R$^{5c}$ each includes straight-chain or branched alkyl groups having 1 to 10 carbon atoms, preferably 1 to 6 carbon atoms, far preferably a methyl group, an ethyl group, an n-propyl group, an i-propyl group, an n-butyl group, an i-butyl group, an s-butyl group and a t-butyl group.

Examples of an alkoxy group represented by A$^1$, A$^2$ and R$^{5c}$ each include straight-chain or branched alkoxy groups having 1 to 6 carbon atoms, preferably a methoxy group, an ethoxy group, an n-propoxy group, an i-propoxy group, an n-butoxy group, an i-butoxy group, an s-butoxy group and a t-butoxy group, particularly preferably a methoxy group and an ethoxy group.

Q represents a group capable of decomposing by an acid to generate a carboxylic acid.

Examples of such a group represented by Q include the same groups as included in examples of Q in the repeating unit (2a).

Examples of repeating units represented by formula (2b) are illustrated below, but these examples should not be construed as limiting the scope of the invention.

[2b-1]

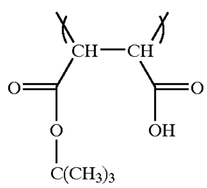

[2b-2]

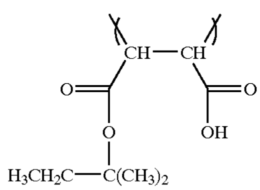

[2b-3]

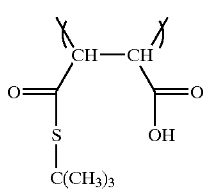

[2b-4]

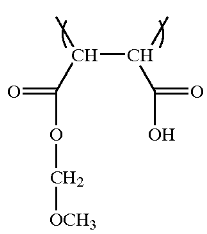

[2b-5]

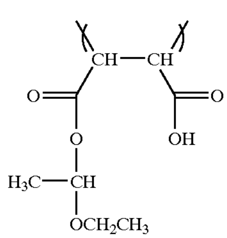

-continued

[2b-6]

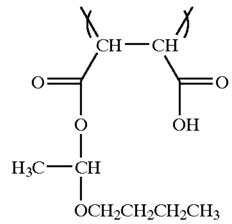

[2b-7]

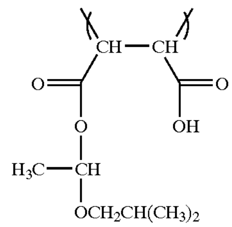

[2b-8]

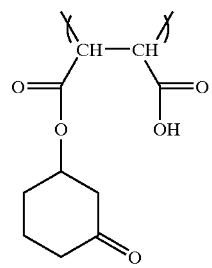

[2b-9]

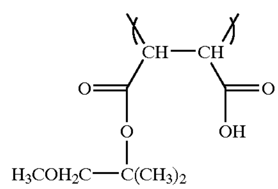

[2b-10]

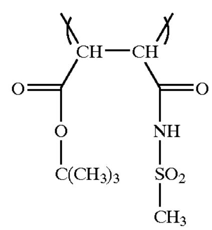

[2b-11]

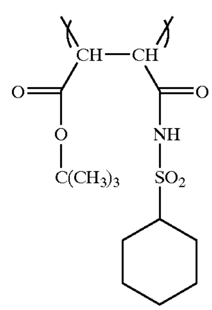

[2b-12]

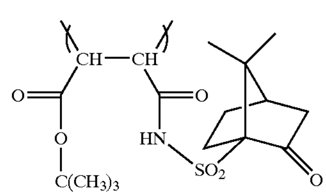

-continued
[2b-13]
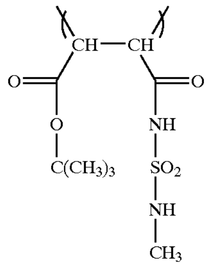
[2b-14]
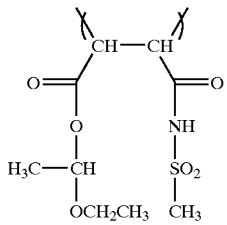
[2b-15]
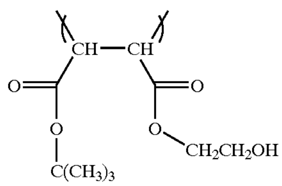
[2b-16]
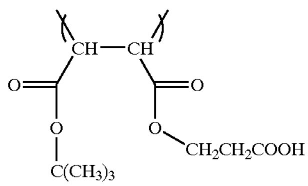
[2b-17]
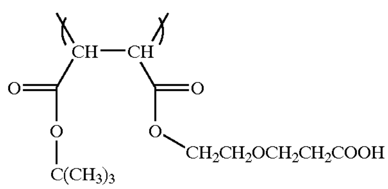
[2b-18]
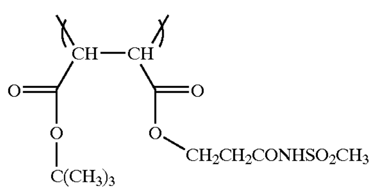
[2b-19]
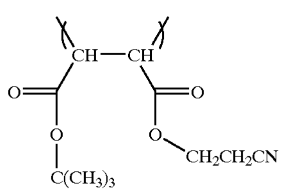
[2b-20]
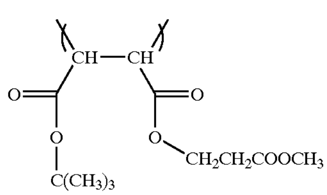
-continued
[2b-21]
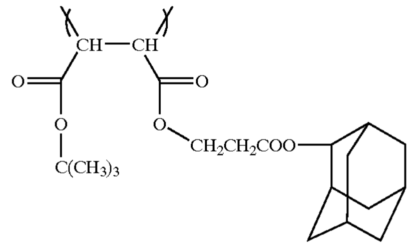
[2b-22]
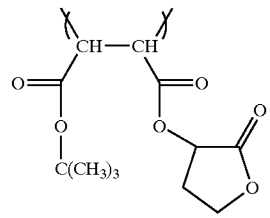
[2b-23]
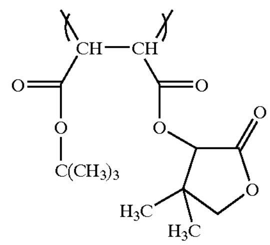
[2b-24]
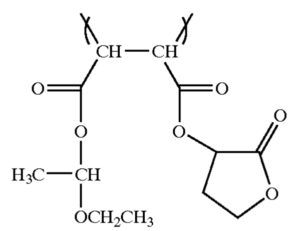
[2b-25]
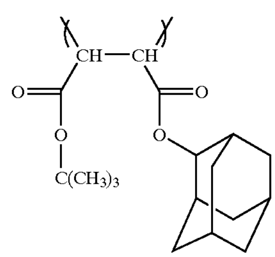
[2b-26]
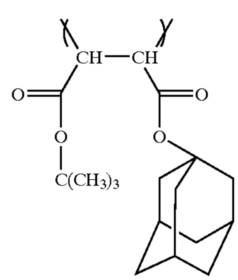

-continued
[2b-27]
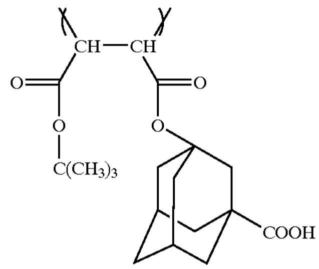
[2b-28]
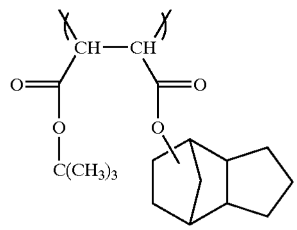
[2b-29]
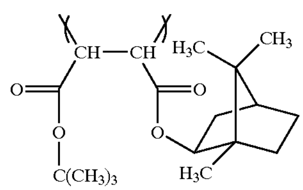
[2b-30]
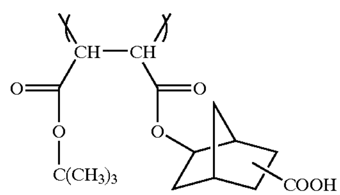
[2b-31]
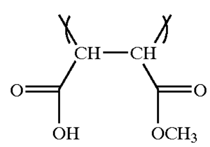
[2b-32]
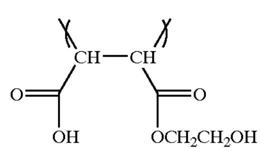
[2b-33]
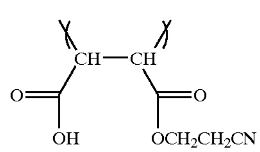
[2b-34]
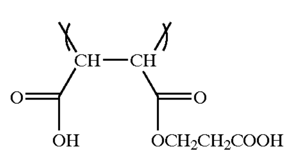
-continued
[2b-35]
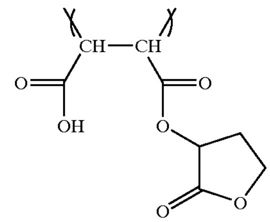
[2b-36]
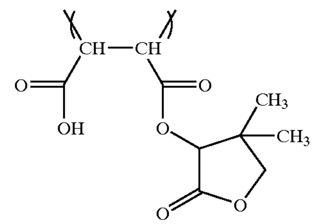
[2b-37]
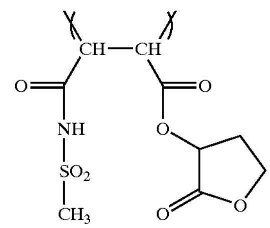
[2b-38]
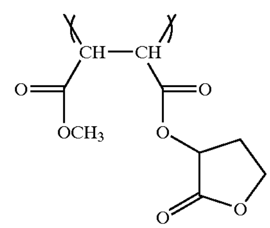
[2b-39]
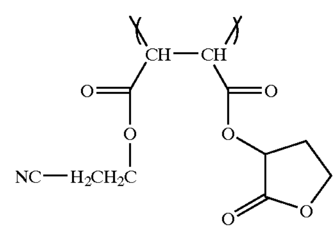
[2b-40]
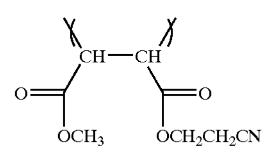
[2b-41]
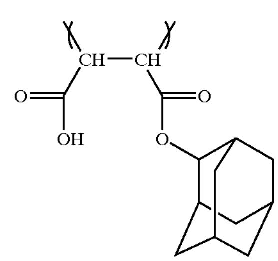

-continued
[2b-42]
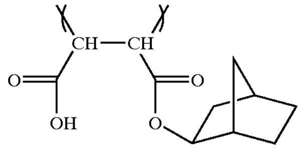
[2b-43]
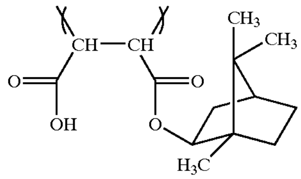
[2b-44]
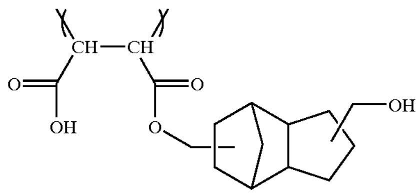
[2b-45]
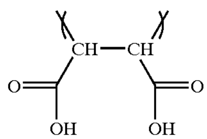
[2b-46]
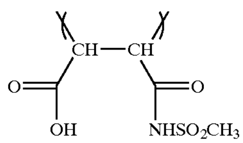
[2b-47]
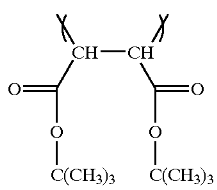
[2b-48]
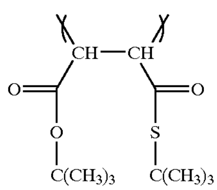
[2b-49]
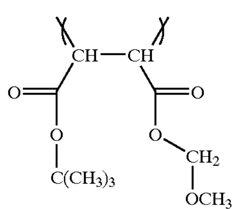
[2b-50]
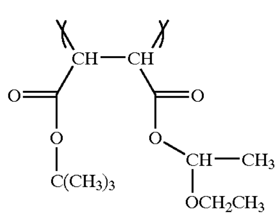
-continued
[2b-51]
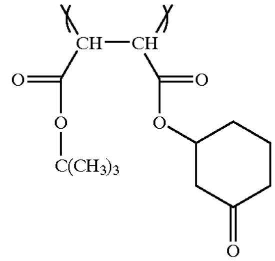
[2b-52]
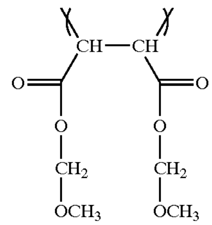
[2b-53]
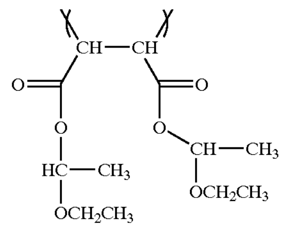
[2b-54]
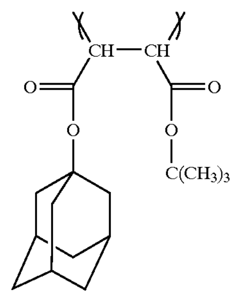
[2b-55]
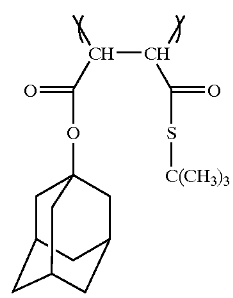
[2b-56]
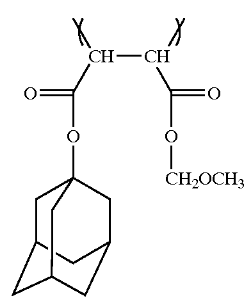

-continued

[2b-57]

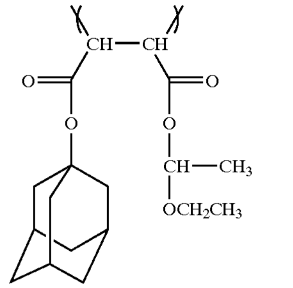

[2b-58]

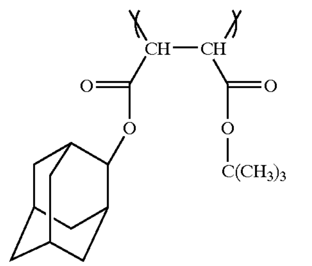

[2b-59]

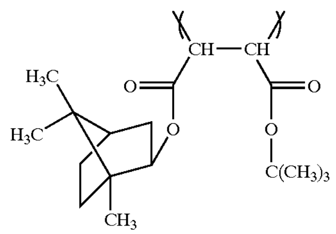

[2b-60]

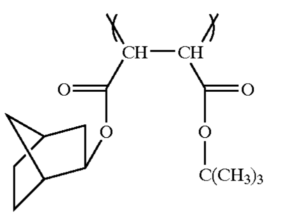

[2b-61]

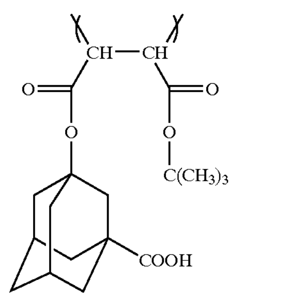

[2b-62]

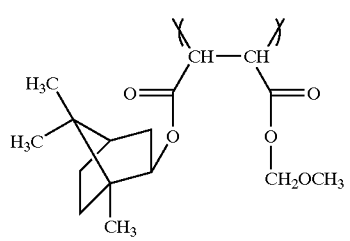

The proportion of the repeating units having groups represented by formula (A) in the acid-decomposable resin is generally from 3 to 90 mole %, preferably from 5 to 70 mole %, far preferably from 10 to 60 mole %.

The proportion of the repeating units having hydrophilic functional groups in the acid-decomposable resin is generally from 1 to 70 mole %, preferably from 5 to 60 mole %, far preferably from 10 to 50 mole %.

The proportion of the repeating units having acid-decomposable groups in the acid-decomposable resin is generally from 3 to 70 mole %, preferably from 5 to 60 mole %, far preferably from 10 to 50 mole %.

The proportion of the repeating units of at least one kind selected from those of formulae (2a) and (2b) in the acid-decomposable resin is generally from 5 to 50 mole %, preferably from 10 to 40 mole %.

The acid-decomposable resin may further comprise other repeating units.

Examples of monomers from which the other repeating units are derived include compounds which each contain one addition-polymerizable unsaturated bond, such as acrylic acid esters, methacrylic acid esters, allyl compounds, vinyl ethers and vinyl esters.

Suitable examples of acrylic acid esters include alkyl acrylates (which contain 1 to 10 carbon atoms in their individual alkyl moieties), such as methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, trimethylolpropane monoacrylate, pentaerythritol monoacrylate and tetrahydrofurfuryl acrylate.

Suitable examples of methacrylic acid esters include alkyl methacrylates (which contain 1 to 10 carbon atoms in their individual alkyl moieties), such as methyl methacrylate, ethyl methacrylate, propyl methacrylate, isopropyl methacrylate, t-butyl methacrylate, amyl methacrylate, hexyl methacrylate, cyclohexyl methacrylate, octyl methacrylate, trimethylolpropane monomethacrylate, pentaerythritol monomethacrylate and tetrahydrofurfuryl methacrylate.

Suitable examples of allyl compounds include allyl esters (such as allyl acetate, allyl caproate, allyl caprylate, allyl laurate, allyl palmitate, allyl stearate, allyl acetoacetate and allyl lactate), and allyloxyethanol.

Suitable examples of vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether and tetrahydrofurfuryl vinyl ether.

Suitable examples of vinyl esters include vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl acetoacetate, vinyl lactate and vinyl cyclohexylcarboxylate.

Examples of other usable compounds having one addition-polymerizable group per molecule include dialkyl itaconates (such as dimethyl itaconate, diethyl itaconate and dibutyl itaconate), dialkyl fumarates (such as dibutyl fumarate) or monoalkyl fumarates, acrylic acid, methacrylic acid, crotonic acid, itaconic acid, acrylonitrile, methacrylonitrile and maleironitrile.

In addition, addition-polymerizable compounds which can copolymerize with monomers as recited above may be used for repeating units.

The weight-average molecular weight of the acid-decomposable resin is not particularly limited, but preferably from 1,000 to 1,000,000, far preferably from 2,000 to 100,000.

The acid-decomposable resin used in the invention may be resin of single kind or resin mixture of two or more kinds.

The content of the acid-decomposable resin used is from 40 to 99 mass %, preferably from 60 to 98 mass %, of the total solids in the resist composition.

Monomers from which the repeating units having the groups represented by formula (A) are derived can be synthesized using the methods described in *Macromolecules,* 1995, 28, 8435–8437, and *J. Am. Chem. Soc.,* 1990, 112, 1931.

Specifically, a monomer from which the repeating units having the groups represented by formula (A) are derived can be synthesized in accordance with the following reaction scheme:

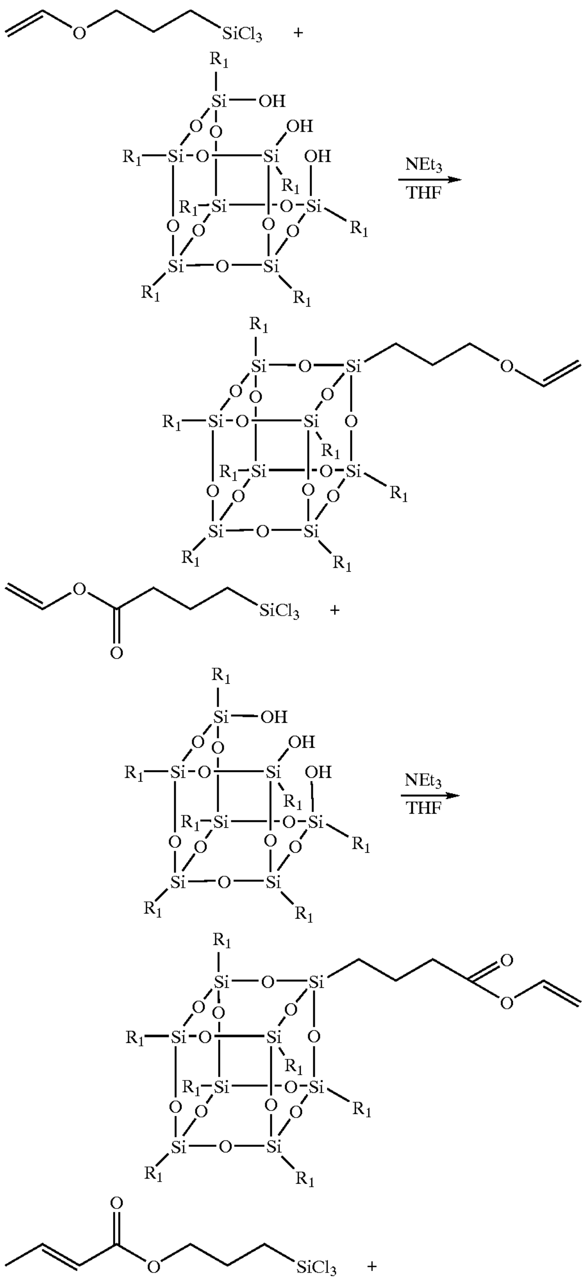

-continued

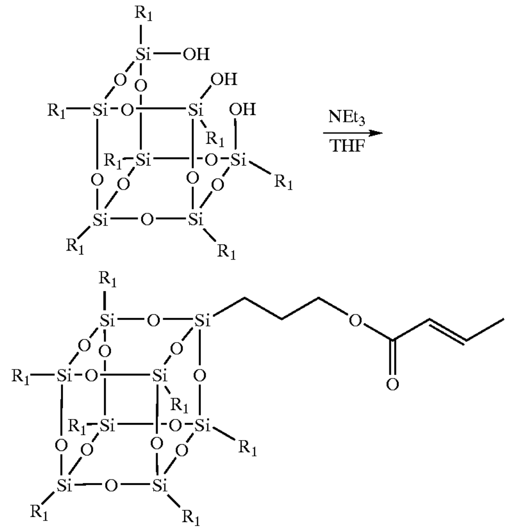

The acid-decomposable resin can be synthesized according to general radical polymerization.

For instance, the acid-decomposable resin can be synthesized in accordance with the following reaction scheme:

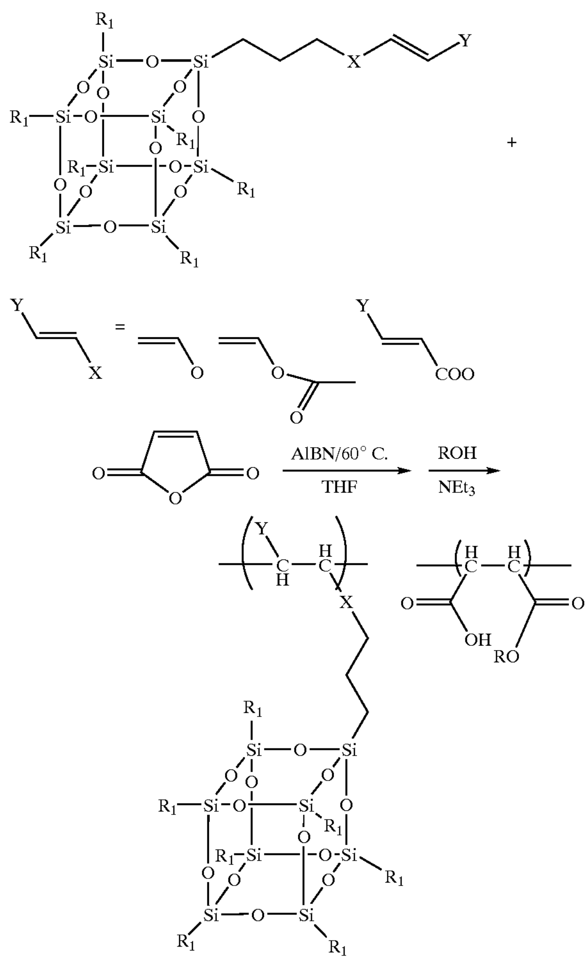

-continued
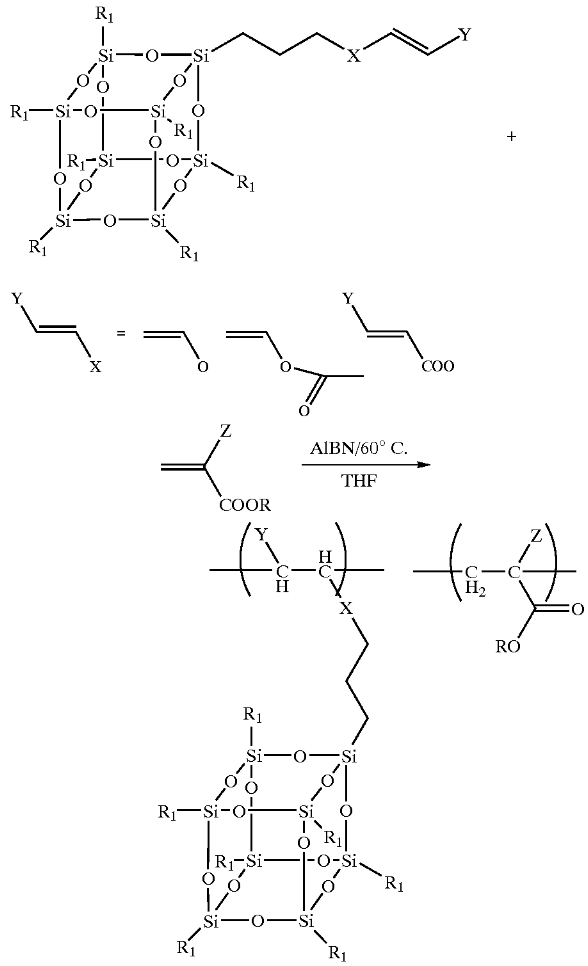
Z = CN, $CF_3$, F
R = H or alkyl group
Examples of acid-decomposable resin used in the invention are illustrated below, but these examples should not be construed as limiting the scope of the invention.
Herein, $A_1$ to $A_{11}$ each represents the groups (A1) to (A11) exemplifying formula (A), respectively.
(a-1)
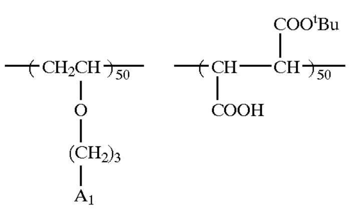
Mw = 6,500
(a-2)
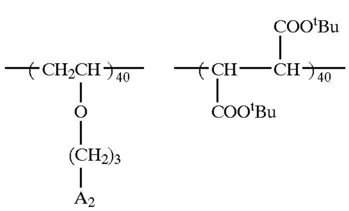
-continued
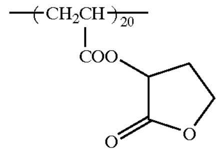
Mw = 8,200
(a-3)
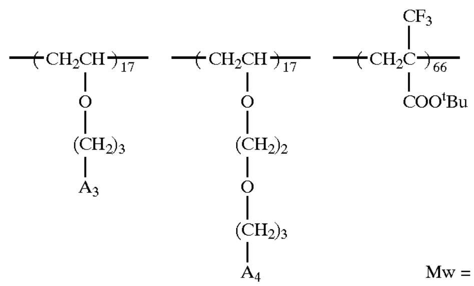
Mw = 7,300
(a-4)
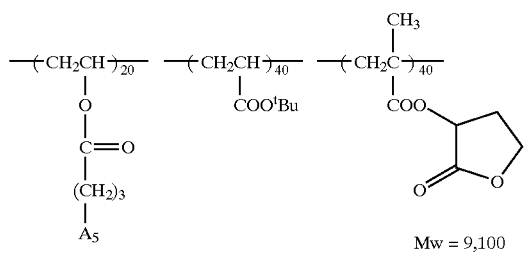
Mw = 9,100
(a-5)
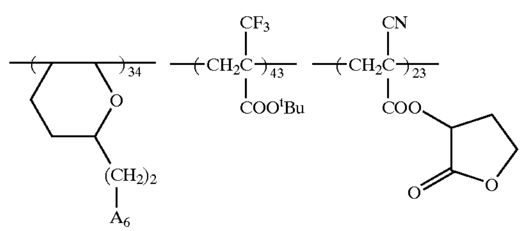
Mw = 6,700
(a-6)
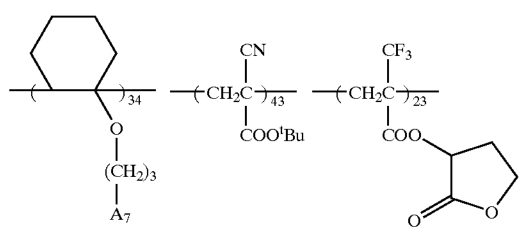
Mw = 7,300
(a-7)
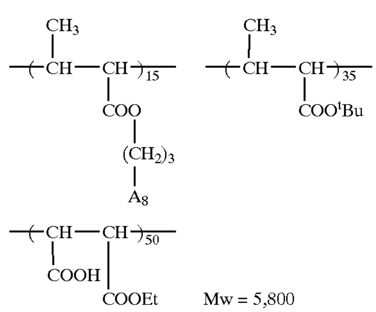
Mw = 5,800

-continued (a-8)

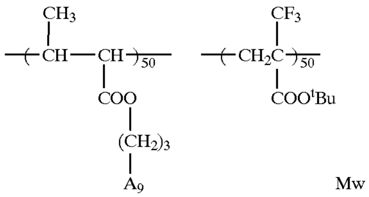

Mw = 5,200

(a-9)

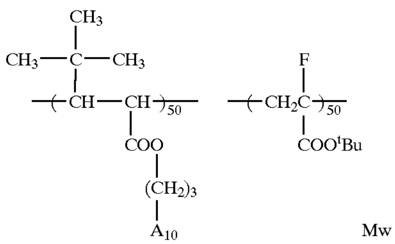

Mw = 6,800

(a-10)

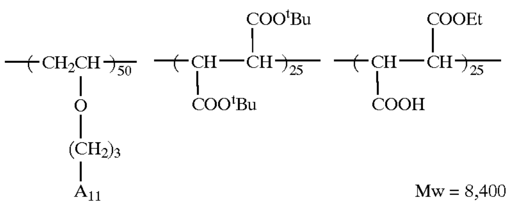

Mw = 8,400

(a-11)

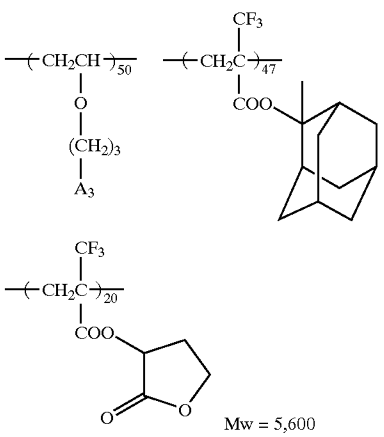

Mw = 5,600

(a-12)

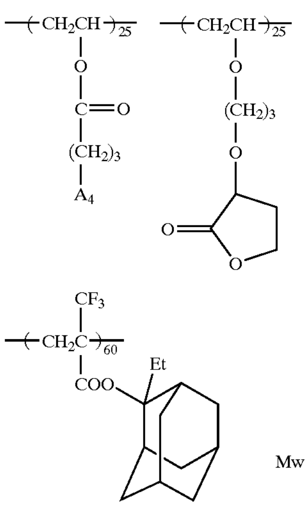

Mw = 7,200

-continued (a-13)

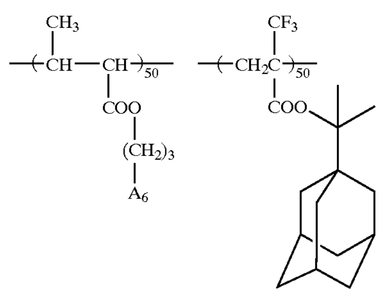

Mw = 5,500

(B) Compound Capable of Generating Acid Upon Irradiation with Actinic Ray or Radiation:

The present positive resist composition comprises a compound capable of generating an acid upon irradiation with an actinic ray or radiation (hereinafter referred to as "photo-acid generator", too).

Photo-acid generators usable in the invention are those selected appropriately from photo-initiators for cationic photopolymerization, photo-initiators for radical photopolymerization, photodecoloring agents for dyes, photodiscoloring agents, compounds known to be used in microresist and generate acids when irradiated with light (including 400 nm to 200 nm ultraviolet rays and far ultraviolet rays, particularly preferably g-ray, h-ray, i-ray and KrF excimer laser beam), ArF excimer laser beam, electron beam, X-ray, molecular beam or ion beam, or mixtures of two or more thereof.

Examples of other photo-acid generators usable in the invention include onium salts, such as diazonium salts, ammonium salts, phosphonium salts, iodonium salts, sulfonium salts, selenonium salts and arsonium salts; organic halogen compounds; organometallic compounds/organic halogen compounds; photo-acid generators having protective groups of o-nitrobenzyl type; compounds capable of generating sulfonic acids by photolysis, typically imide sulfonates; disulfone compounds; diazoketosulfones; and diazodisulfone compounds.

In addition, it is also possible to use polymers having main or side chains into which groups or compounds capable of generating acids upon irradiation with the rays as recited above are introduced.

Further, the compounds capable of generating acids by the action of light as described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent No. 126,712 can also be used.

Photo-acid generators which can be used to particular advantage as the photo-acid generator of Component (B) are illustrated in the following <A-1> to <A-4>.

<A-1>: Trihalomethyl-Substituted Oxazole or s-triazine Derivatives Represented by the Following Formula (PAG1) or (PAG2), Respectively (PAG1)

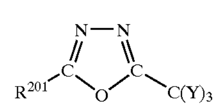

-continued (PAG2)

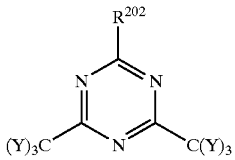

In the above formulae, $R^{201}$ represents a substituted or unsubstituted aryl or alkenyl group, $R^{202}$ represents a substituted or unsubstituted aryl, alkenyl or alkyl group, or —$C(Y)_3$, and Y represents a chlorine or bromine atom.

The following are examples of those compounds, but these exemplified compounds should not be construed as limiting the scope of photo-acid generators usable in the invention.

(PAG1-1)

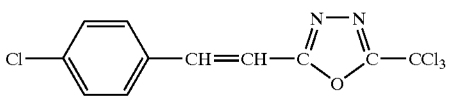

(PAG1-2)

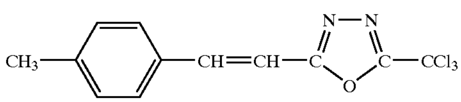

(PAG1-3)

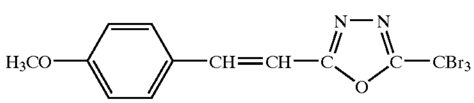

(PAG1-4)

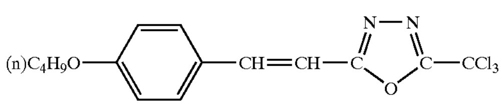

(PAG1-5)

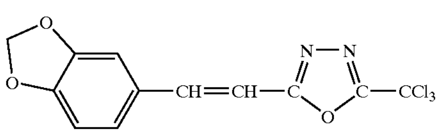

(PAG1-6)

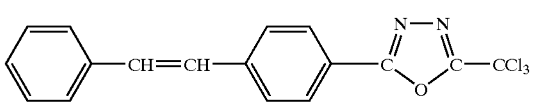

(PAG1-7)

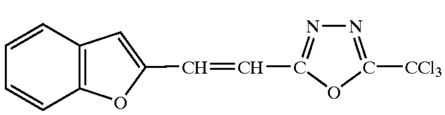

(PAG1-8)

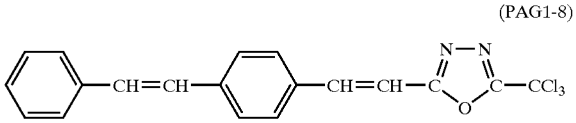

(PAG2-1)

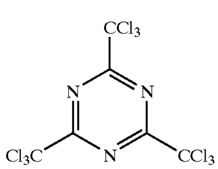

-continued (PAG2-2)

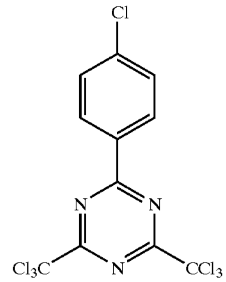

(PAG2-3)

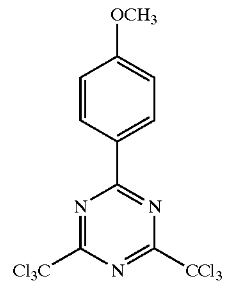

(PAG2-4)

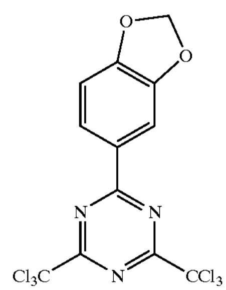

(PAG2-5)

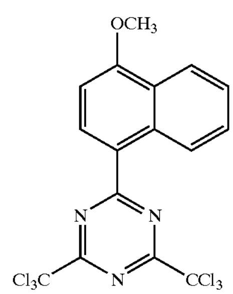

(PAG2-6)

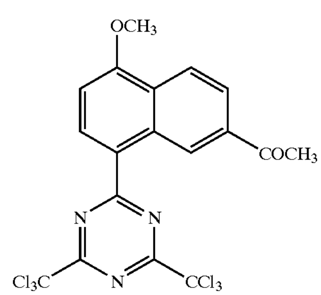

-continued (PAG2-7)

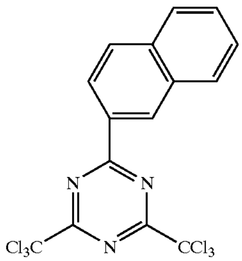

(PAG2-8)

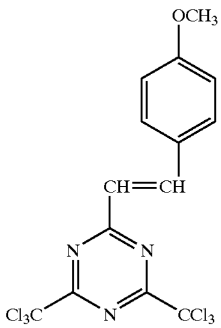

(PAG2-9)

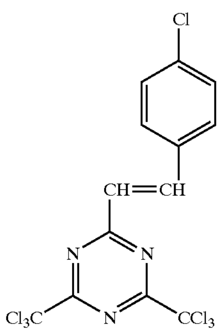

(PAG2-10)

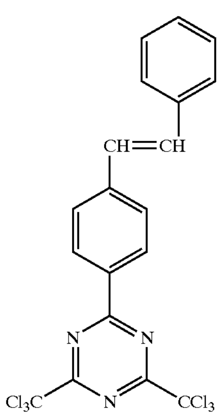

<A-2>: Iodonium Salts Represented by the Following Formula (PAG3) or Sulfonium Salts Represented by the Following Formula (PAG4)

(PAG3)

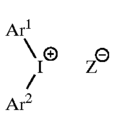

-continued (PAG4)

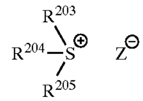

In the above formulae, $Ar^1$ and $Ar^2$ independently represent a substituted or unsubstituted aryl group, and $R^{203}$, $R^{204}$ and $R^{205}$ independently represent a substituted or unsubstituted alkyl or aryl group.

$Z^-$ represents a counter ion, with examples including $BF_4^-$, $AsF_6^-$, $PF_6^-$, $SbF_6^-$, $SiF_6^{2-}$, $ClO_4^-$, perfluoroalkanesulfonic acid anions such as $CF_3SO_3^-$, alkylsulfonic acid anions such as camphorsulfonic acid anion, aromatic sulfonic acid anions such as pentafluorobenzenesulfonic acid anion, benzenesulfonic acid anion and triisopropylbenzenesulfonic acid anion, condensed polynuclear aromatic sulfonic acid anions such as naphthalene-1-sulfonic acid anion, anthraquinonesulfonic acid anion, and dyes containing sulfonic acid groups. However, the counter anion of $Z^-$ should not be construed as being limited to those examples. Further, these anion species may further have substituents.

In addition, any two of $R^{203}$, $R^{204}$ and $R^{205}$ and $Ar^1$ and $Ar^2$ may be combined with each other via their respective single bonds or substituent groups.

Examples of those compounds are illustrated below, but these exemplified compounds should not be construed as limiting the scope of photo-acid generators usable in the invention.

(PAG3-1)

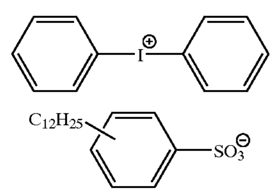

(PAG3-2)

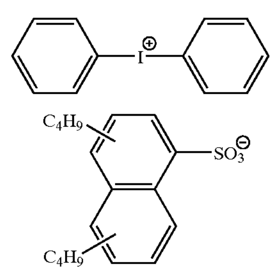

(PAG3-3)

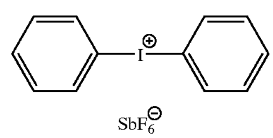

(PAG3-4)

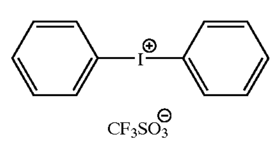

-continued
(PAG3-5)
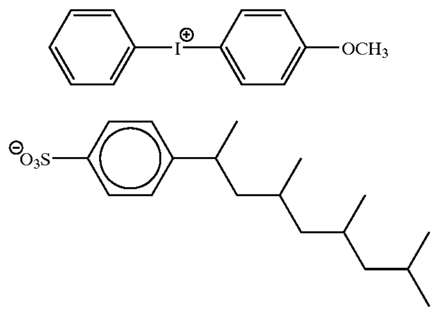
(PAG3-6)
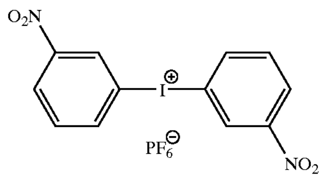
(PAG3-7)
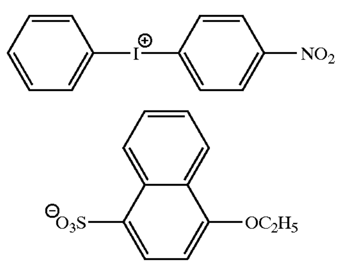
(PAG3-8)
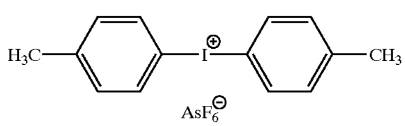
(PAG3-9)
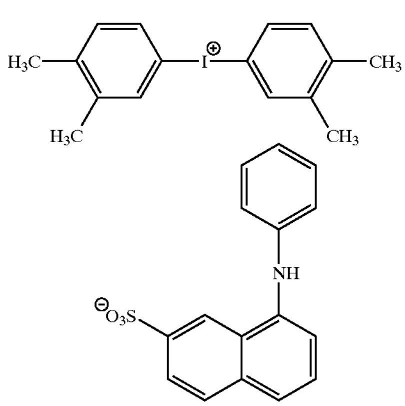
-continued
(PAG3-10)
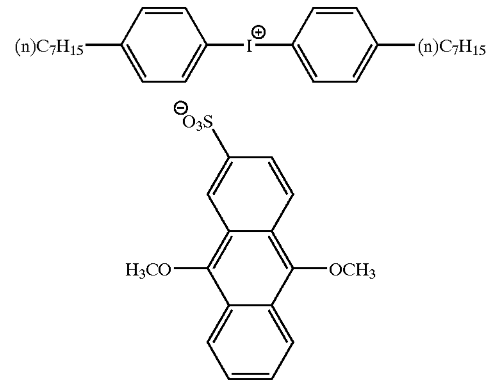
(PAG3-11)
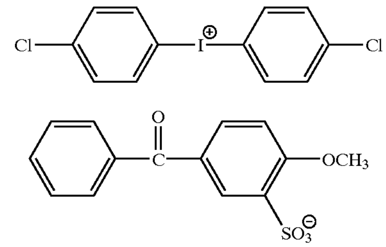
(PAG3-12)
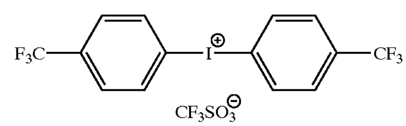
(PAG3-13)
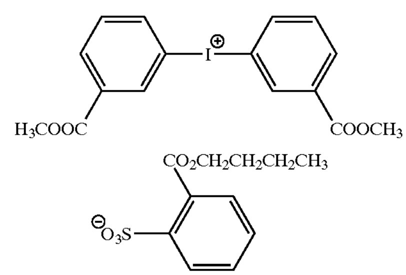
(PAG3-14)
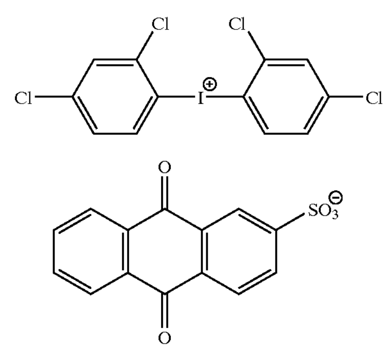
(PAG3-15)
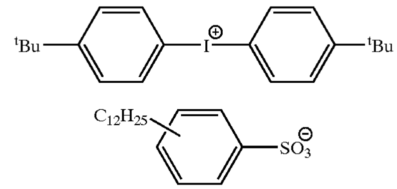

-continued
(PAG3-16)
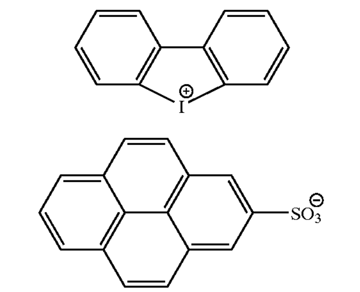
(PAG3-17)
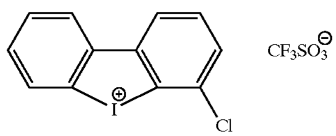
(PAG3-18)
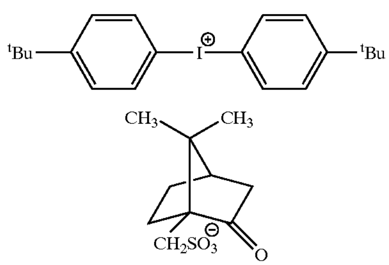
(PAG3-19)
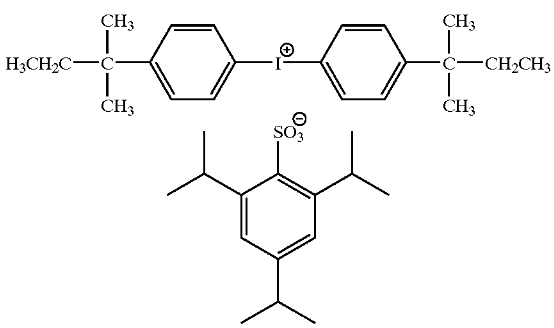
(PAG3-20)
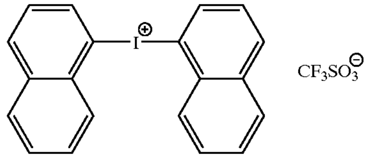
(PAG3-21)
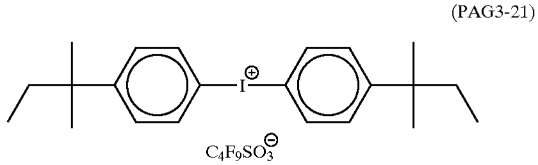
-continued
(PAG3-22)
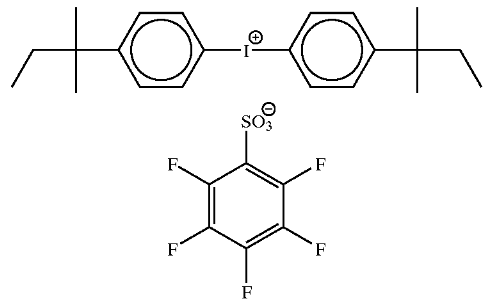
(PAG3-23)
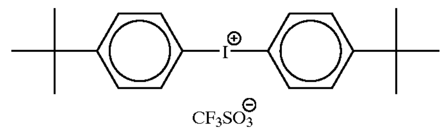
(PAG3-24)
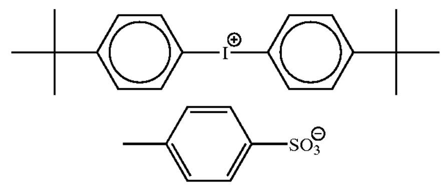
(PAG3-25)
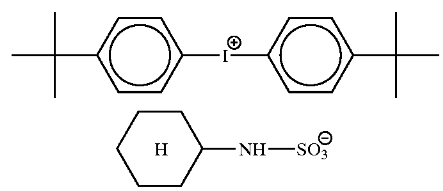
(PAG4-1)
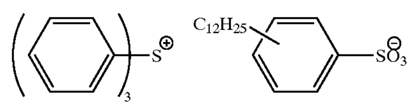
(PAG4-2)
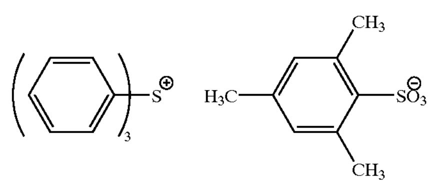
(PAG4-3)
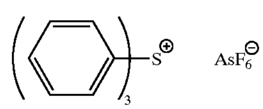
(PAG4-4)
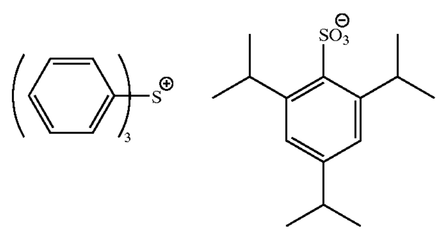
(PAG4-5)
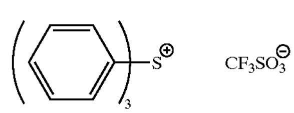

-continued
(PAG4-6)
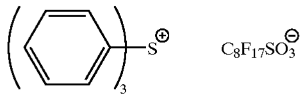
(PAG4-7)
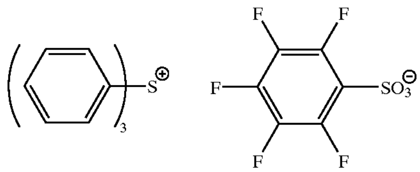
(PAG4-8)
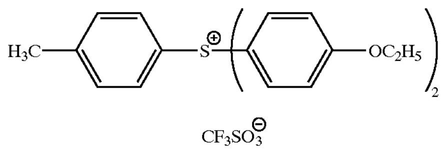
(PAG4-9)
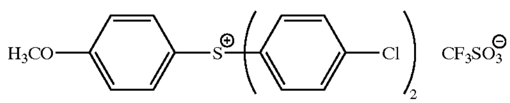
(PAG4-10)
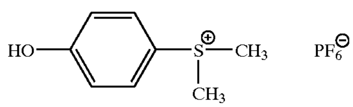
(PAG4-11)
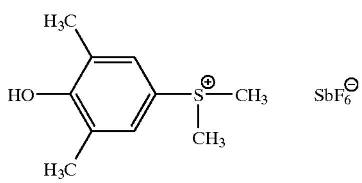
(PAG4-12)
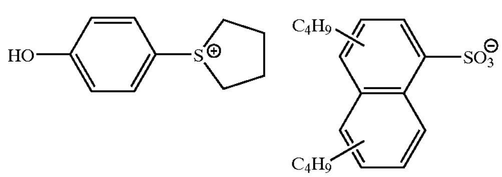
(PAG4-13)
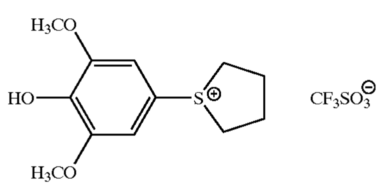
(PAG4-14)
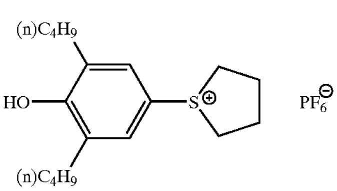
(PAG4-15)
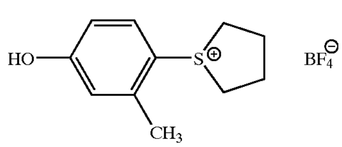
-continued
(PAG4-16)
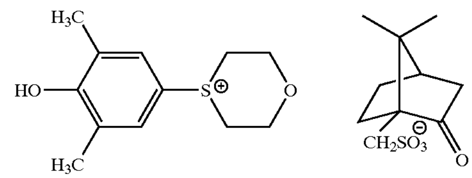
(PAG4-17)
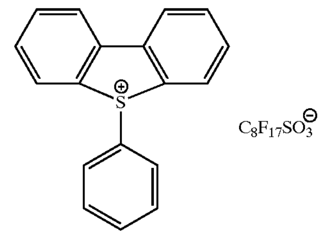
(PAG4-18)
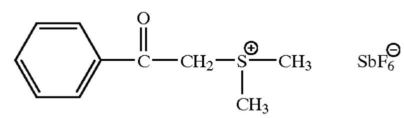
(PAG4-19)
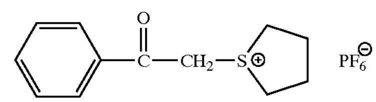
(PAG4-20)
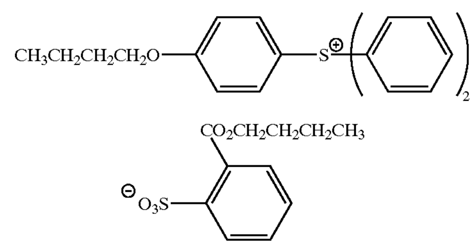
(PAG4-21)
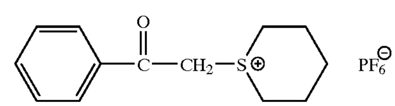
(PAG4-22)
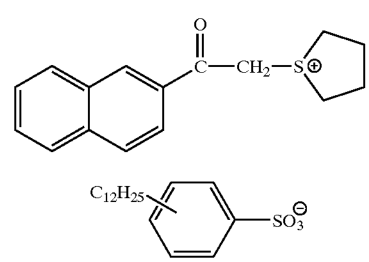
(PAG4-23)
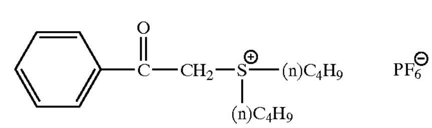
(PAG4-24)
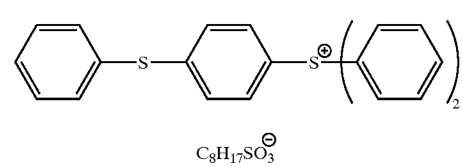

-continued
(PAG4-25)
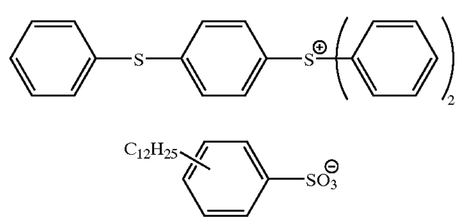
(PAG4-26)
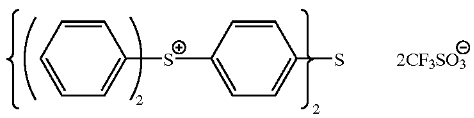
(PAG4-27)
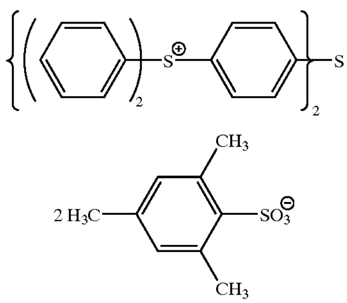
(PAG4-28)
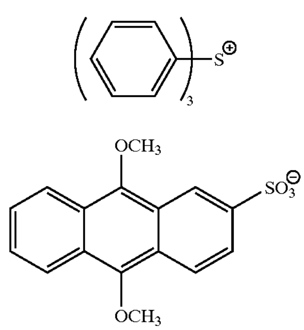
(PAG4-29)
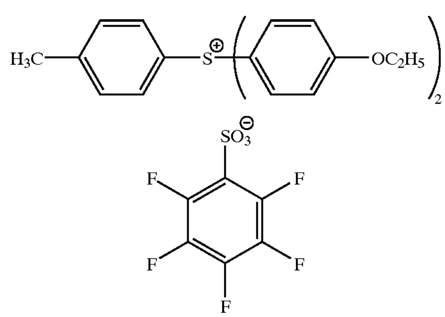
(PAG4-30)
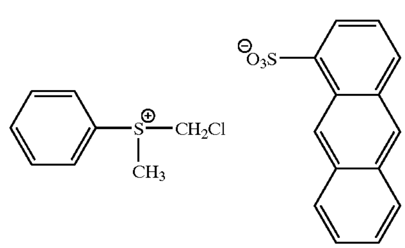
-continued
(PAG4-31)
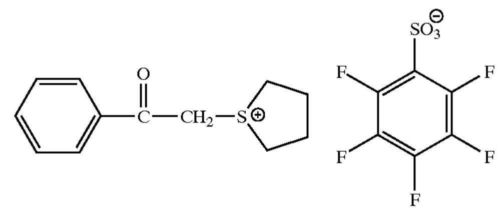
(PAG4-32)
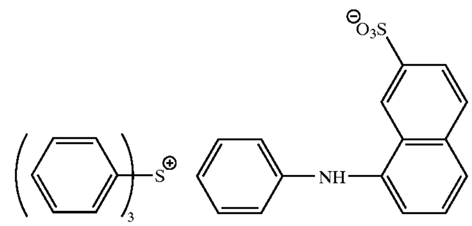
(PAG4-33)
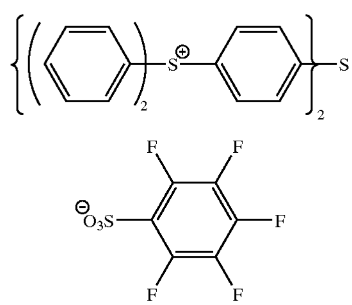
(PAG4-34)
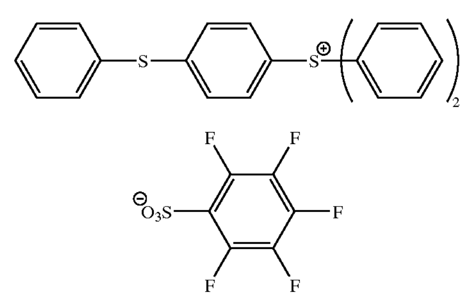
(PAG4-35)
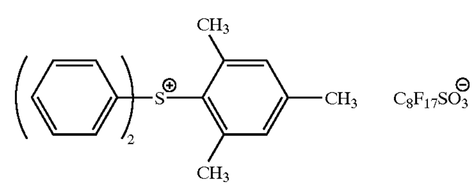
(PAG4-36)
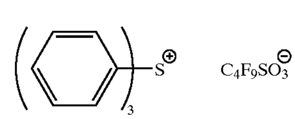

-continued (PAG4-37)

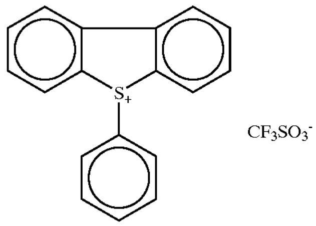

The onium salts represented by formulae (PAG3) and (PAG4) respectively are known compounds, and can be synthesized using the methods as disclosed in J. W. Knapczyk et al., *J. Am. Chem. Soc.,* 91, 145 (1969), A. L. Maycok et al., *J. Org. Chem.,* 35, 2532 (1970), E. Goethas et al., *Bull. Soc. Chem. Belg.,* 73, 546 (1964), H. M. Leicester, *J. Am. Chem. Soc.,* 51, 3587 (1929), J. V. Crivello et al., *J. Poly. Chem. Ed.,* 18, 2677 (1980), U.S. Pat. Nos. 2,807,648 and 4,247,473, and JP-A-53-101331.

<A-3>: Disulfone Derivatives Represented by the Following Formula (PAG5), or iminosulfonate Derivatives Represented by the Following Formula (PAG6)

(PAG5)

$$Ar^3—SO_2—SO_2—Ar^4$$

(PAG6)

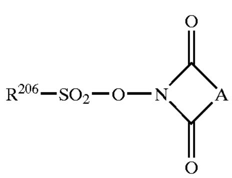

In the above formulae, $Ar^3$ and $Ar^4$ independently represent a substituted or unsubstituted aryl group, $R^{206}$ represents a substituted or unsubstituted alkyl or aryl group, and A represents a substituted or unsubstituted alkylene, alkenylene or arylene group.

Examples of those derivatives are illustrated below, but these exemplified compounds should not be construed as limiting the scope of photo-acid generators usable in the invention.

(PAG5-1)

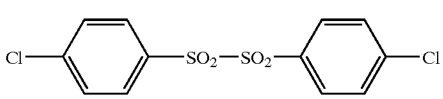

(PAG5-2)

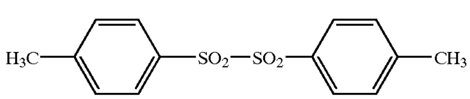

(PAG5-3)

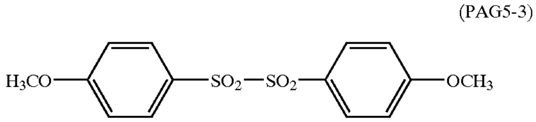

(PAG5-4)

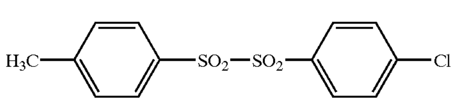

-continued (PAG5-5)

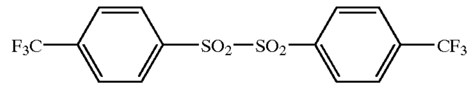

(PAG5-6)

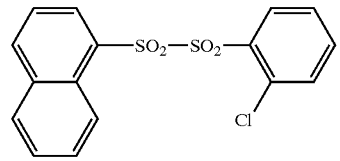

(PAG5-7)

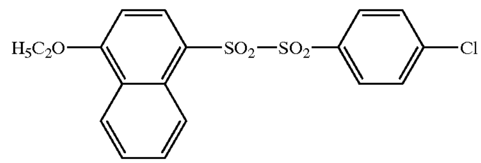

(PAG5-8)

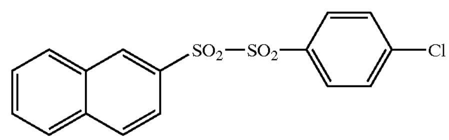

(PAG5-9)

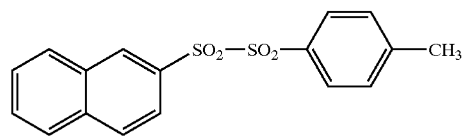

(PAG5-10)

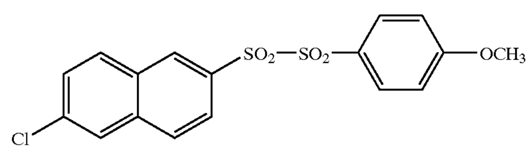

(PAG5-11)

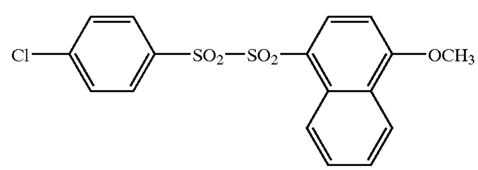

(PAG5-12)

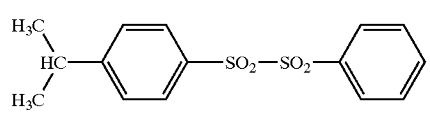

(PAG5-13)

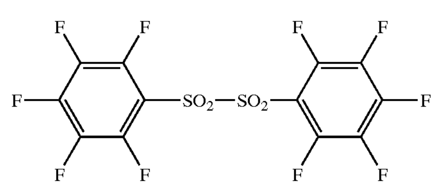

(PAG5-14)

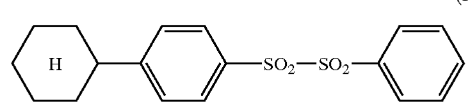

-continued
(PAG5-15)
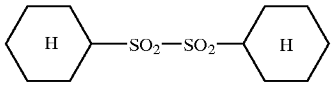
(PAG6-1)
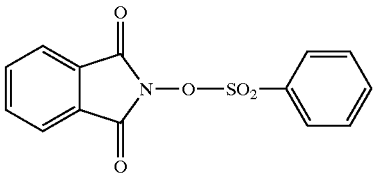
(PAG6-2)
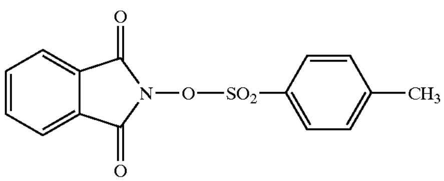
(PAG6-3)
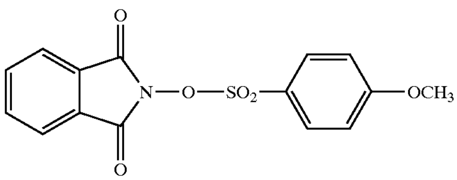
(PAG6-4)
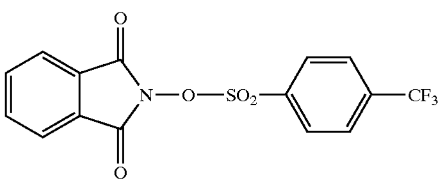
(PAG6-5)
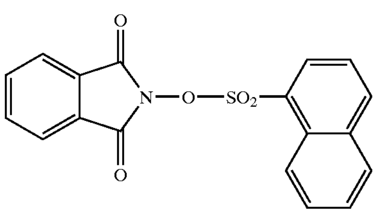
(PAG6-6)
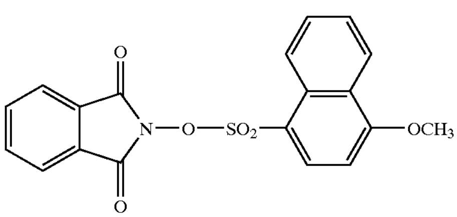
(PAG6-7)
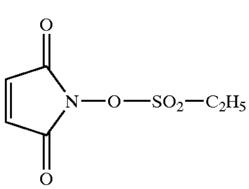
-continued
(PAG6-8)
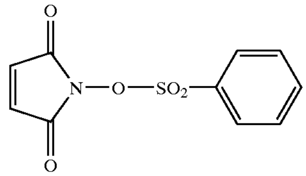
(PAG6-9)
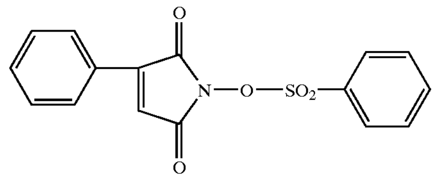
(PAG6-10)
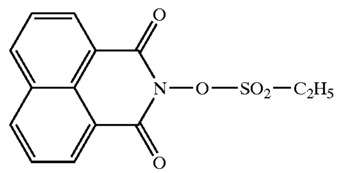
(PAG6-11)
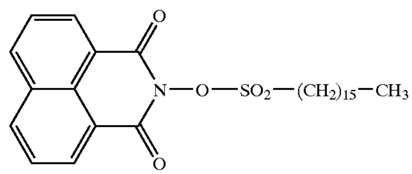
(PAG6-12)
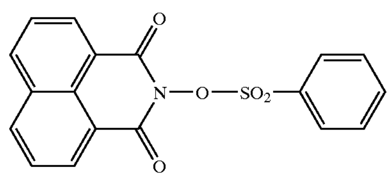
(PAG6-13)
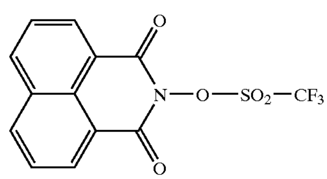
(PAG6-14)
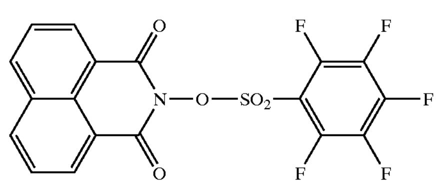
(PAG6-15)
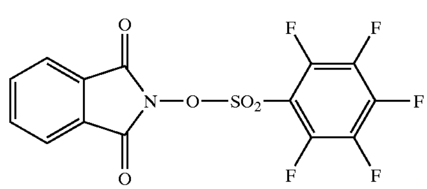

-continued (PAG6-16)

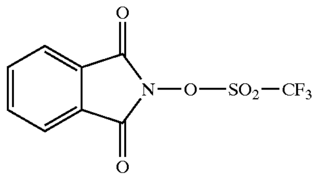

(PAG6-17)

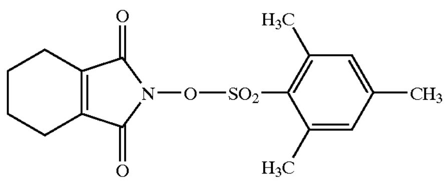

(PAG6-18)

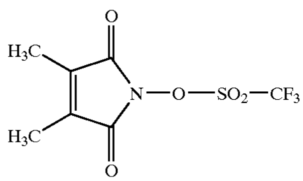

(PAG6-19)

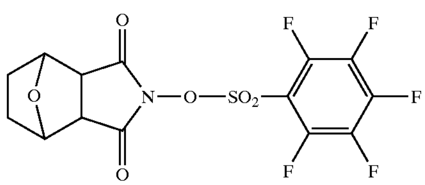

(PAG6-20)

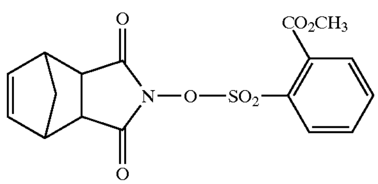

<A-4>: Diazodisulfone Derivatives Represented by the Following Formula (PAG7)

(PAG7)

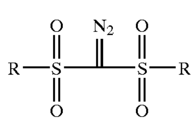

In the above formula, R represents a straight-chain, branched or cyclic alkyl group, or an unsubstituted or substituted aryl group.

The following are examples of those derivatives, but these exemplified compounds should not be construed as limiting the scope of photo-acid generators usable in the invention.

(PAG7-1)

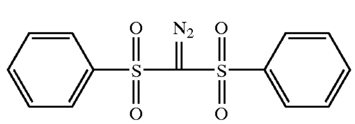

-continued (PAG7-2)

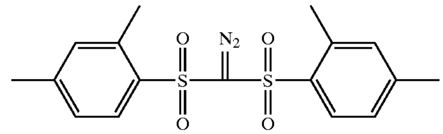

(PAG7-3)

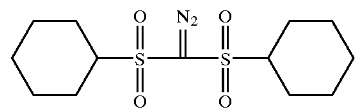

(PAG7-4)

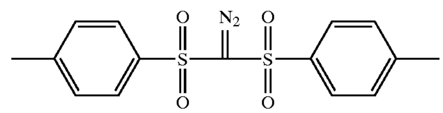

(PAG7-5)

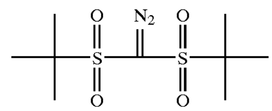

Those photo-acid generators of Component (B) are added in a proportion of generally from 0.001 to 40% by weight, preferably from 0.01 to 20% by weight, particularly preferably from 0.1 to 10% by weight, based on the total solids in the present resist composition.

(C) Fluorine-Based and/or Silicon-Based Surfactant, and Nonionic Surfactant

It is preferable that the present positive resist composition further comprises (C) at least one kind of surfactant selected from fluorine-based and/or silicon-based surfactants (namely, surfactants containing fluorine atoms, silicon atoms, or both) or nonionic surfactants.

By containing the surfactant (C), the present positive resist composition can provide resist patterns reduced in stickiness and development defects at satisfactory sensitivity and resolution when a source of exposure light with wavelengths of 250 nm or below, especially 220 nm or below, is used.

Examples of those fluorine-based and/or silicon-based surfactants include the surfactants as disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable as fluorine-based and/or silicone-based surfactants include Eftop EF301 and EF303 (manufactured by Shin-Akita Kasei K.K.), Florad FC430 and FC431 (manufactured by Sumitomo 3M, Inc.), Megafac F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troysol S-366 (manufactured by Troy Chemical Industries, Inc.). Further, organosiloxane polymer KP-341 (manufactured by Shin-Etsu Chemical Co., Ltd.) can be used as a silicon-based surfactant.

In addition to known surfactants as recited above, specific polymers containing fluorinated aliphatic groups can be used as fluorine-based and/or silicone-based surfactants. Such polymers contain fluorinated aliphatic groups derived from fluorinated aliphatic compounds synthesized by a telomerization method (telomer method) or an oligomerization method (oligomer method). More specifically, these fluorinated aliphatic compounds can be synthesized by the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly(oxyalkylene)methacrylates, wherein the fluorinated aliphatic group-containing units may be distributed randomly or in blocks. Examples of those poly (oxyalkylene) groups include a poly(oxyethylene) group, a poly(oxypropylene) group and a poly(oxybutylene) group.

In addition, the poly(oxyalkylene) groups may be units containing alkylene groups differing in chain length in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly (oxyalkylene) acrylates (or methacrylates) may be binary copolymers or at least ternary copolymers prepared by copolymerizing at least two different kinds of fluorinated aliphatic group-containing monomers and at least two different kinds of poly(oxyalkylene) acrylates (or methacrylates) at a time.

Examples of fluorinated aliphatic group-containing polymers as commercially available surfactants include Megafac F178, F-470, F-473, F-475, F-476 and F-472 (manufactured by Dainippon Ink & Chemicals, Inc.). Additional examples of fluorinated aliphatic group-containing polymers include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

Examples of nonionic surfactants usable in the invention include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylenesorbitan monostearate, polyoxyethylenesorbitan trioleate and polyoxyethylenesorbitan tristearate.

The suitable content of the component (C) is from 0.0001 to 2% by weight, preferably from 0.001 to 1% by weight, based on the total solids in the present positive resist composition.

(D) Organic Basic Compound

It is preferable that the present positive resist composition further contains an organic basic compound. As the organic basic compound, compounds having stronger basicity than phenol are suitable.

Of such compounds, nitrogen-containing basic compounds having the following structural formulae ($A^1$) to ($E^1$) are used to particular advantage.

The use of such organic basic compounds can produce an effect of lessening changes caused in resist performances with the time lapsed during the period from exposure to after heating.

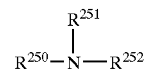
($A^1$)

Herein, $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms. Further, $R^{251}$ and $R^{252}$ may be combined with each other to form a ring.

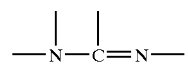
($B^1$)

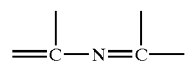
($C^1$)

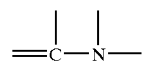
($D^1$)

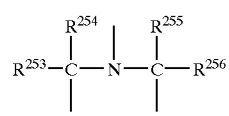
($E^1$)

In the formula ($E^1$), $R^{253}$, $R^{254}$, $R^{255}$ and $R^{256}$, which may be the same or different, each represents an alkyl group having 1 to 6 carbon atoms.

The compounds preferable by far are nitrogen-containing cyclic compounds or basic compounds having at least two per molecule of nitrogen atoms differing in chemical environment.

It is advantageous that the nitrogen-containing cyclic compounds have polycyclic structures. Suitable examples of nitrogen-containing polycyclic compounds include compounds represented by the following formula (VI):

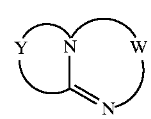
(VI)

In formula (VI), Y and W independently represent a straight-chain, branched and cyclic alkylene group which may contain a hetero atom and be substituted.

Herein, the hetero atom may be a nitrogen atom, a sulfur atom or an oxygen atom. Examples of such an alkylene group include an alkylene group having 2 to 10 carbon atoms, preferably an alkylene group having 2 to 5 carbon atoms. Examples of a substituent the alkylene group may have include an alkyl group having 1 to 6 carbon atoms, an aryl group, an alkenyl group, a halogen atom, a halogen-substituted alkyl group.

Further, examples of a compound represented by formula (VI) include compounds shown below.

(VI-1)

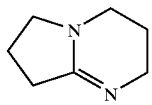

(VI-2)

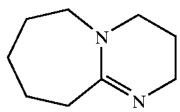

(VI-3)

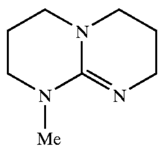

(VI-4)

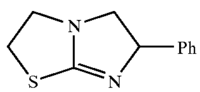

(VI-5)

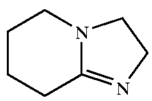

(VI-6)

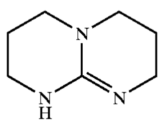

(VI-7)

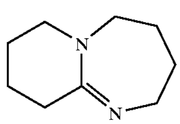

(VI-8)

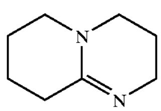

Among these compounds as above, 1,8-diazabicyclo[5.4.0]undeca-7-ene and 1,5-diazabicyclo[4.3.0]nona-5-ene are especially preferred over the others.

As the basic nitrogen-containing compounds having at least two per molecule of nitrogen atoms differing in chemical environment, especially preferred are compounds containing both a substituted or unsubstituted amino group and a cyclic structure containing one or more nitrogen atoms and compounds having an alkylamino group.

Appropriate examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine.

Examples of substituents suitable for the above-recited compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of nitrogen-containing basic compounds which can be used to particular advantage include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole and methyldiphenylimidazole.

However, these examples should not be construed as limiting the scope of the basic compounds usable in the invention.

These nitrogen-containing basic compounds are used alone or as a combination of two or more thereof. The proportion of the nitrogen-containing basic compounds is generally from 0.001 to 10% by weight, preferably from 0.01 to 5% by weight, based on the total solids in the resist composition.

Then, solvents used suitably in the present positive resist composition are described. Examples of such solvents include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate.

These solvents are used alone or as combinations of two or more thereof. What solvent or combination of solvents is selected is of importance to the present positive resist composition because it has influences on the composition's solubility, suitability for coating on a substrate and storage stability. In addition, the water contents in solvents used affect resist performances, so the lower the better.

Further, it is appropriate that the content of metallic impurities, such as metals, and the content of impurity elements, such as chloride ion, in the present positive resist composition be reduced to 100 ppb or below. When such impurities are present in contents higher than the foregoing limit, undesirable troubles, such as malfunction, defects and yield reduction, tend to be caused at the time of producing semiconductor devices.

It is appropriate that the solid ingredients of the positive resist composition be dissolved in the solvent(s) as recited above so that their concentration falls within the range of 3 to 40% by weight, preferably 5 to 30% by weight, far preferably 7 to 20% by weight.

After preparing a solution by dissolving the present positive resist composition in a solvent or a combination of solvents, it is generally preferable that the solution is passed through a filter having a pore diameter of the order of 0.05 to 0.2 μm for the purpose of removing extraneous substances.

The present positive resist composition can furthermore contain, if needed, acid-decomposable dissolution-inhibiting compounds, dyes, plasticizers, photo-sensitizers, cross-linking agents, photo-base generators, thermo-base generators, spectral sensitizers, compounds capable of promoting dissolution in developers, and compounds lowering their basicities upon exposure to light (photo bases).

Examples of acid-decomposable dissolution-inhibiting compounds usable in the present positive resist composition include the low-molecular acid-decomposable dissolution-inhibiting compounds disclosed in JP-A-5-134415 and JP-A-6-51519.

Examples of plasticizers usable in the present positive resist composition include the compounds disclosed in JP-A-4-212960, JP-A-8-262720, European Patent Nos. 735, 422, 416,873 and 439,371, and U.S. Pat. No. 5,846,690, such as di(2-ethylhexyl) adipate, n-hexyl benzoate, di-n-octyl phthalate, di-n-butylphthalate, benzyl n-butyl phthalate, and dihydroabietyl phthalate.

Examples of compounds capable of promoting dissolution in developers which can be used in the invention include the polyhydroxy compounds disclosed in JP-A-4-134345, JP-A-4-217251, JP-A-7-181680, JP-A-8-211597 and U.S. Pat. Nos. 5,688,628 and 5,972,559.

Of those compounds, aromatic polyhydroxy compounds, such as 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl) -1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane and para[α,α,α'α'-tetrakis (4-hydroxyphenyl)]xylene, are used to advantage.

In addition, organic acids such as salicylic acid, diphenolic acid and phenolphthalein, can be used, and besides, the sulfonamide compounds disclosed in JP-A-5-181263 and JP-A-7-92680, the carboxylic acids and the carboxylic acid anhydrides disclosed in JP-A-4-248554, JP-A-5-181279 and JP-A-7-92679, and alkali-soluble resins, such as the polyhydroxystyrene resins disclosed in JP-A-11-153869, can also be added.

As the dyes used in the invention, fat dyes and basic dyes are suitable. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

To the present composition can further be added the ammonium salts disclosed in JP-A-7-28247, European Patent No. 616,258, U.S. Pat. No. 5,525,443, JP-A-9-127700, European Patent No. 762,207 and U.S. Pat. No. 5,783,354, specifically including tetramethylammonium hydroxide, tetra-n-butylammonium hydroxide and betaine, and the compounds lowering their basicities upon exposure to light (photo-bases) disclosed in JP-A-5-232706, JP-A-6-11835, JP-A-6-242606, JP-A-6-266100, JP-A-7-333851, JP-A-7-333844, U.S. Pat. No. 5,663,035 and European Patent No. 677,788.

Furthermore, it is possible to confer sensitivity to i-ray or g-ray on the present positive resist composition by adding a spectral sensitizer as recited below to the composition and sensitizing the composition in the spectral region longer than wavelengths of far ultraviolet rays wherein the photo-acid generators used have no absorption.

Suitable examples of such a spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavine, cetoflavine-T, 9,10-diphenylanthracene, 9-fluorenone, acetophenone, phenanthrene, 2-nitrofluorenone, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,3-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, spectral sensitizers usable for the foregoing purpose should not be construed as being limited to those examples.

Additionally, those spectral sensitizers can also serve as absorbents of far ultraviolet rays emitted from a light source used. In this case, such absorbents can reduce the light reflected from a substrate and lessen the influence by multiple reflection inside the resist film, thereby controlling the standing waves.

Examples of a photo-base generator which can be added to the present composition include the compounds disclosed in JP-A-4-151156, JP-A-4-162040, JP-A-5-197148, JP-A-5-5995, JP-A-6-194834, JP-A-8-146608, JP-A-10-83079, and European Patent No. 622,682. More specifically, 2-nitrobenzylcarbamate, 2,5-dinitrobenzylcyclohexylcarbamate, N-cyclohexyl-4-methylphenylsulfonamide and 1,1-dimethyl-2-phenylethyl-N-isopropylcarbamate are suited very well for use as photo-base generators. These photo-base generators are added for the purpose of improving the shape of resist profile.

Examples of a thermo-base generator usable in the present composition include the compounds disclosed in JP-A-5-158242, JP-A-5-158239, and U.S. Pat. No. 5,576,143.

The present positive resist composition is used as second-layer resist coated on first-layer resist coated previously on a substrate, such as a substrate used for production of precision integrated circuit elements (e.g., silicon/silicon dioxide coating), a glass substrate, a ceramic substrate and a metal substrate. The layer formation of the present positive resist composition is carried out by dissolving all the ingredients of the composition into a solvent and coating the solution obtained in accordance with a spin coating method or a spraying method.

Examples of a developer usable for the present second resist layer include aqueous solutions of alkalis, such as inorganic-alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcoholamines (e.g., dimethylethanolamine, triethanolamine), quaternary ammonium salts (e.g., tetramethylammonium hydroxide, tetraethylammonium hydroxide), and cyclic amines (e.g., pyrrole, piperidine).

The aqueous solutions of alkalis to which alcohol, surfactants and aromatic hydroxyl group-containing compounds are further added in appropriate amounts can also be used. Of those aqueous solutions, the solutions using tetramethylammonium hydroxide as alkali are preferred over the others.

The first-layer resist used is an appropriate organic macromolecular film, and may be chosen from known photoresist of various kinds. For instance, any of FH series and FHi series made by Fuji Film-Olin Co., Ltd, and PFI series made by Sumitomo Chemical Co., Ltd. can be used as the first-layer resist.

In using the present positive resist composition, the first resist layer is formed on a substrate before doing anything else. The formation of this layer is carried out by dissolving compounds to constitute the first resist layer in an appropriate solvent and coating the solution obtained on a substrate in accordance with a spin coating method or a spraying method. The suitable thickness of the first resist layer is from 0.1 to 2.0μm, preferably from 0.2 to 1.5 μm, particularly preferably from 0.2 to 0.12 μm.

It is undesirable that the first resist layer has a thickness greater than the foregoing upper limit because it causes a problem that the fine patters formed tend to topple.

Then, second resist layer formation is carried out using the present resist composition. Prior to formation of the second resist layer, however, it is preferable to perform heat treatment of the first resist layer. The suitable temperature for the heat treatment is from 150 to 250° C., preferably from 170 to 240° C., particularly preferably from 180 to 230° C. This heat treatment can be performed with an apparatus such as a hot plate or a thermal oven.

The suitable heat treatment time, though depends on the heat treatment temperature, is set within the range of 10 to 1,000 seconds, preferably 20 to 600 seconds, when the heat treatment is carried out at a temperature from 180 to 230° C.

And successively, the second resist layer is formed using the present positive resist composition in the same way as the first resist layer. The suitable thickness of the second resist layer is from 0.03 to 0.6 μm, preferably from 0.04 to 0.5 μm, particularly preferably from 0.05 to 0.45 μm.

Then, the double-layer resist thus prepared is brought to a patterning process. As the first step, the coating of the resist composition for the second layer undergoes patterning. Specifically, registration of a mask is carried out as required, and then the coating as the second resist layer is irradiated with high-energy beam via the mask, thereby rendering the irradiated areas of the resist composition soluble in an aqueous alkali solution. Successively thereto, the coating is developed with an aqueous alkali solution to form patterns.

As the second step, dry etching is performed. Specifically, this processing is effected by using the patterns of the resist composition coating as a mask and subjecting an organic macromolecular film as the first-layer resist to oxygen plasma etching via that mask. Thus, fine patterns having a high aspect ratio are formed. The etching processing of the organic macromolecular film by oxygen plasma is the same art as the plasma etching utilized for exfoliating a resist film after the etching of a substrate by a conventional photo-etching operation has completed. This processing can be carried out with a cylindrical plasma etching apparatus wherein oxygen is used as a reactive gas, or an etching gas. The oxygen gas used herein may be mixed with another gas, such as sulfurous acid gas.

EXAMPLES

Now, synthesis examples, examples and comparative examples are illustrated below. However, the following examples should not be construed as limiting the scope of the invention.

Synthesis Example of Monomer

Synthesis Example 1

Synthesis of Monomer (a)

Monomer (a) illustrated below was synthesized by the same method as described in *Macromolecules,* 1995, 28, 8435–8437 and *J. Am. Chem. Soc.,* 1990, 112, 1931, except that the starting material in the trisilanol synthesis as the first step was changed to the corresponding trichlorosilane and the trichlorosilane derivative to undergo corner capping was changed to the corresponding vinyl ether moiety-containing compound. $A_1$ in the following formula stands for the group represented by formula (A) wherein all $R_1$s are isopropyl groups.

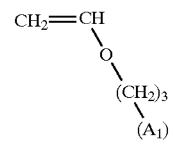

Synthesis Examples of Resins

Synthesis Example 1

Synthesis of Resin (a-1)

After 25 g of a 1:1 by mole mixture of Monomer (a) illustrated above and maleic anhydride was added to 120 g of dry THF, the mixture was heated to 65° C. in a stream of nitrogen. At the time when the temperature of the reaction solution was stabilized, a polymerization initiator V-65 (manufactured by Wako Pure Chemical Industries, Ltd.) was added in an amount equivalent to 10 mole % of the total monomers, and thereby the reaction was initiated. After the reaction was continued for 6 hours, the reaction mixture was diluted with 2 parts of THF, and then poured into a large volume of hexane to result in deposition of white powder.

For the purpose of reducing the residual monomers and low molecular components, the powder thus deposited was dissolved in acetone and thereto hexane was added little by little to precipitate a polymer. The polymer thus precipitated was washed with an 8:2 mixture of hexane and acetone, and dried under vacuum to yield a polymer. This polymer was dissolved in dry THF, allowed to react with an equimolecular amount of t-butoxy potassium, treated with hydrochloric acid, and then precipitated into hexane from ethyl acetate, thereby yielding the intended Resin (a-1).

The weight average molecular weight of Resin (a-1) was found to be 6,500 as measured by GPC and calculated in terms of polystyrene.

Resins (a-7) and (a-10) were synthesized in similar manners to the above.

Synthesis Example 2

Synthesis of Resin (a-2)

After 25 g of a 40:40:20 by mole mixture of Monomer (b) (corresponding to Monomer (a) wherein $A_1$ is replaced by $A_2$, and $A_2$ stands for the group represented by formula (A) wherein all $R_1$s are cyclopropyl groups), di-t-butyl maleate and γ-butyrolactone acrylate was added to 120 g of dry THF, the mixture was heated to 65° C. in a stream of nitrogen. At the time when the temperature of the reaction solution was stabilized, a polymerization initiator V-65 (manufactured by Wako Pure Chemical Industries, Ltd.) was added in an amount equivalent to 10 mole % of the total monomers, and thereby the reaction was initiated. After the reaction was continued for 6 hours, the reaction mixture was diluted with 2 parts of THF, and then poured into a large volume of hexane to result in deposition of white solid.

For the purpose of reducing the residual monomers and low molecular components, the powdery solid thus deposited was dissolved in acetone and thereto hexane was added little by little to precipitate a polymer. The polymer thus precipitated was washed with an 8:2 mixture of hexane and acetone, and dried under vacuum to yield the intended Resin (a-2).

The weight average molecular weight of Resin (a-2) was found to be 8,200 as measured by GPC and calculated in terms of polystyrene.

Resins (a-3) to (a-6), (a-8), (a-9) and (a-11) to (a-13) were synthesized in similar manners to the above.

Synthesis Example 3

Synthesis of Comparative Resin (C)

After 10.4 g of trimethylallylsilane, 9.8 g of maleic anhydride and 5.3 g of t-butyl acrylate were was added to 34 g of dry THF, the admixture was heated to 65° C. in a stream of nitrogen. At the time when the temperature of the reaction solution was stabilized, a polymerization initiator V-65 (manufactured by Wako Pure Chemical Industries, Ltd.) was added in an amount equivalent to 10 mole % of the total monomers, and thereby the reaction was initiated. After the reaction was continued for 6 hours, the reaction mixture was diluted with 2 parts of THF, and then poured into a large volume of hexane to result in deposition of white powder.

For the purpose of reducing the residual monomers and low molecular components, the powder thus deposited was dissolved in acetone and thereto hexane was added little by little to precipitate a polymer. The polymer thus precipitated was washed with an 8:2 mixture of hexane and acetone, and dried under vacuum to yield a resin as Comparative Resin (C).

The weight average molecular weight of Comparative Resin (C) was found to be 5,600 as measured by GPC and calculated in terms of polystyrene.

Synthesis Example 4

Synthesis of Comparative Resin (D)

Comparative Resin (D) was synthesized in the same manner as in Synthesis Example 2, except that the mixture of monomers was replaced by 25 g of a 10:90 by mole mixture of (meth)acrylate Monomer (d) illustrated below which was synthesized by the same method as described in *Macromolecules,* 1995, 28, 8435–8437 and *J. Am. Chem. Soc.,* 1990, 112, 1931, and t-butyl methacrylate. $A_3$ in the following formula stands for the group represented by formula (A) wherein all $R_1$s are isobutyl groups.

The weight average molecular weight of Comparative Resin (D) was found to be 8,500 as measured by GPC and calculated in terms of polystyrene.

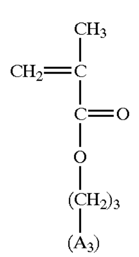

Example 1

(1) Formation of Lower Resist Layer:

FHi-028DD resist (i-ray resist manufactured by Fuji-Olin Co., Ltd.) was coated on a 6-inch silicon wafer with a spin coater, Mark 8 (made by Tokyo Electron Limited), and then baked at 90° C. for 90 seconds, thereby forming a uniform film having a thickness of 0.55 μm.

Further, this coating was heated at 200° C. for 3 minutes. Thus, the lower resist layer having a thickness of 0.40 μm was obtained.

(2) Formation of Upper Resist Layer:

| | |
|---|---|
| Component (A): Resin (a-1) | 0.9 g |
| Component (B): (b-1) described below | 0.05 g |

In addition to the above-mentioned components, 0.005 g of 1,5-diazabicyclo[4.3.0]-5-nonene as an organic basic compound, and 0.001 g of Megafac F176 (manufactured by Dainippon Ink & Chemicals, Inc.) were dissolved in 9 g of methoxypropyl acetate. The solution obtained was finely filtered with a membrane filter having a pore diameter of 0.1 μm, thereby preparing a second resist composition according to the invention.

On the lower resist layer, the second resist composition was coated in the same manner as described above, and heated at 130° C. for 90 seconds, thereby forming the upper resist layer having a thickness of 0.20 μm.

The thus obtained wafer was exposed to light as the exposure amount was altered by use of a resolution mask-mounted ArF Excimer Stepper 9300 made by ISI.

Thereafter, the wafer was placed in a clean room and heated at 120° C. for 90 seconds. Then, it was developed for 60 seconds with a tetrahydroammonium hydroxide developer (2.38%), rinsed with distilled water, and followed by drying. Thus, patterns (upper-layer patterns) were formed.

Further, the wafer having patterns in the upper layer was subjected to etching (dry development) with a parallel-plate reactive ion etching apparatus, DES-245R (made by Plasma System), thereby forming patterns in the lower layer. The etching gas used was oxygen gas, the pressure thereof was 20 millitorr and the impressed power was 100 $mW/cm^2$. Observations of the thus formed resist patterns were performed with a scanning electron microscope.

Resolution, mask linearity, scum, thinning of resist film and SEM shrink were evaluated in accordance with the following methods, respectively.

<Resolution>

Resolution was evaluated by the smallest of all dimensions of line-and-space patterns separated and resolved in the lower layer under the light exposure having achieved reproduction of the 0.14 μm line-and-space patterns of the mask.

<Mask Linearity>

Line widths (CDs) of line-and-space patterns formed corresponding to mask dimensions of 170 nm, 175 nm, 180 nm, 190 nm and 200 nm at the pitch of 300 nm were measured by using a critical dimension scanning electron microscope (CD-SEM), S-9260 (made by Hitachi, Ltd.), under conditions that the acceleration voltage was 300V and the current value was 5 pA. Results obtained are shown in FIG. 1. The higher the linearity of a line graph in the figure, the better the mask linearity.

<Scum>

Prior to the formation of the lower-layer patterns, the profiles of the upper-layer patterns formed were observed specially with a scanning electron microscope (SEM), 4300 (made by Hitachi, Ltd.), and the remaining condition of development scum was rated on a 1-to-3 scale (wherein observation of no scum was rated as A, observation of appreciable scum was rated as C, and observation of scum on a level intermediate between 3 and 1 was rated as B).

<Thinning of Resist Film>

Prior to the formation of the lower-layer patterns, the profiles of the upper-layer patterns formed were observed specially with a scanning electron microscope (SEM), 4300 (made by Hitachi, Ltd.), the thickness of the resist film was measured, and compared with that of the SEM cross-sectional image before development. Thinning of the resist film was rated on a 1-to-3 scale.

Specifically, a case where the film thickness after development was 98% or above of that before development was rated as A, a case where the film thickness after development was from below 98% to 95% of that before development was rated as B, and a case where the film thickness after development was below 95% of that before development was rated as C.

<SEM Shrink>

Prior to the formation of the lower-layer patterns, the 0.14 μm line-and-space upper-layer patterns formed under the light exposure reproducing the 0.14 μm line-and-space patterns of the mask were measured specially. The measurements were made as follows: By using a critical dimension scanning electron microscope (CD-SEM), S-8840 (made by Hitachi, Ltd.), under conditions that the acceleration voltage was 800V and the current value was 8 pA, dimension (line width) measurement at the same spot was repeated every 10 seconds in accordance with a standard method.

SEM shrink was expressed in terms of the difference between the 1st and the 20th dimension measurements, and rated as A or B. Specifically, a difference below 5% of the initial line width was rated as A, while a difference not smaller than 5% of the initial line width was rated as B.

The evaluation results of resolution, scum, thinning of resist film and SEM shrink are shown in Table 2.

Examples 2 to 13

Second resist compositions according to the invention were prepared in the same manner as in Example 1, except that the resins, the photo-acid generators, the surfactants, the organic basic compounds and the solvents set forth in Table 1 in the same amounts as those in Example 1 respectively were used in place of the resin, the photo-acid generator, the surfactant, the organic basic compound and the solvent used in Example 1, respectively. The photo-acid generators, the surfactants, the organic basic compounds and the solvents used herein are recited below.

Each of these compositions was coated, exposed to light, developed and etched in the same manners as in Example 1, and further its resolution, scum, film thinning and SEM shrink were evaluated by the same methods as in Example 1, respectively. The evaluation results of resolution, scum, film thinning and SEM shrink are shown in Table 2. The results of mask linearity examination are shown in FIG. 1.

TABLE 1

| | Resin | Photo-acid generator | Surfactant | Organic basic compound | Solvent |
|---|---|---|---|---|---|
| Example | | | | | |
| 1 | (a-1) | b-1 | W-1 | d-1 | S-1 |
| 2 | (a-2) | b-2 | W-2 | d-2 | S-1 |
| 3 | (a-3) | b-3 | W-3 | d-1 | S-1 |
| 4 | (a-4) | b-4 | W-1 | d-3 | S-1 |
| 5 | (a-5) | b-2 | W-2 | d-2 | S-1 |
| 6 | (a-6) | b-2 | W-1 | d-2 | S-1/S-2 = 70/30 |
| 7 | (a-7) | b-1 | W-2 | d-1 | S-1/S-2 = 50/50 |
| 8 | (a-8) | b-4 | W-1 | d-1 | S-1/S-2 = 80/20 |
| 9 | (a-9) | b-2 | W-2 | d-3 | S-1 |
| 10 | (a-10) | b-1 | W-3 | d-2 | S-1 |
| 11 | (a-11) | b-3 | W-2 | d-2 | S-1 |
| 12 | (a-12) | b-2 | W-1 | d-2 | S-1 |
| 13 | (a-13) | b-1 | W-1 | d-1 | S-1 |
| Comparative Example | | | | | |
| 1 | Comparative Resin (C) | b-1 | W-1 | d-1 | S-1 |
| 2 | Comparative Resin (D) | b-1 | W-1 | d-1 | S-1 |

The following are the photo-acid generators in Table 1.

(b-1): triphenyl sulfonium-trifluoromethanesulfonate (b-2): tri(t-butylphenyl)sulfonium-perfluorobutane-sulfonate (b-3): diphenyl-2,4,6-trimethyl)phenylsulfonium-perfluorooctanesulfonate (b-4): triphenylsulfonium-2,4,6-triisopropylphenyl-sulfonate The following are the surfactants in Table 1.

Fluorine-containing surfactant (W-1):

Megafac F176 (manufactured by Dainippon Ink & Chemicals, Inc.)

Fluorine- and silicon-containing surfactant (W-2):

Megafac R08 (manufactured by Dainippon Ink & Chemicals, Inc.)

Silicon-containing surfactant (W-3):

organosiloxane polymer, KP341 (manufactured by Shin-Etsu Chemical Co., Ltd)

The follosing are the organic basic compounds in Table 1.

(d-1): 1,5-diazabicyclo[4.3.0]-5-nonene (d-2): 1,8-diazabicyclo[5.4.0]-7-undencene (d-3): 2-phenylbenzimidazole The following are the solvents in Table 1.

(S-1): methoxypropyl acetate (S-2): 2-methoxypropanol

Incidentally, the ratios between two kinds of solvents used in Table 1 are indicated by weight ratio.

Comparative Example 1

A second resist composition was prepared in the same manner as in Example 1, except that the comparative Resin (C) was used in place of Resin (a-1), coated, exposed, developed and etched in the same way as in Example 1. The thus formed resist patterns were evaluated by the same methods as in Example 1. Evaluation results of resolution, scum, film thinning and SEM shrink are shown in Table 2. And the result of mask linearity examination is shown in FIG. 1.

Comparative Example 2

A second resist composition was prepared in the same manner as in Example 1, except that the comparative Resin (D) was used in place of Resin (a-1), coated, exposed, developed and etched in the same way as in Example 1. The thus formed resist patterns were evaluated by the same methods as in Example 1. Evaluation results of resolution, scum, film thinning and SEM shrink are shown in Table 2. And the result of mask linearity examination is shown in FIG. 1.

TABLE 2

| | Resolution (μm) | Scum | Thinning of resist film | SEM shrink |
|---|---|---|---|---|
| Example 1 | 0.110 | A | A | A |
| Example 2 | 0.110 | A | A | A |
| Example 3 | 0.105 | A | A | A |
| Example 4 | 0.110 | A | A | A |
| Example 5 | 0.105 | A | A | A |
| Example 6 | 0.105 | A | A | A |
| Example 7 | 0.105 | A | A | A |
| Example 8 | 0.105 | A | A | A |
| Example 9 | 0.105 | A | A | A |
| Example 10 | 0.105 | A | A | A |
| Example 11 | 0.110 | A | A | A |
| Example 12 | 0.105 | A | A | A |
| Example 13 | 0.105 | A | A | A |
| Comparative Example 1 | 0.140 | A | A | B |
| Comparative Example 2 | 0.125 | C | C | A |

As can be seen from the evaluation results shown in Table 2 and FIG. 1, the present positive resist compositions were superior to the comparative ones in resolution, mask linearity, scum, thinning of resist film and SEM shrink.

The positive resist compositions according to the invention can offer excellent performance on all of resolution, mask linearity, scum, thinning of resist film and SEM shrink.

What is claimed is:

1. A positive resist composition comprising:

(A) a resin capable of decomposing under action of an acid and increasing solubility in an alkali developer, and (B) a compound capable of generating an acid upon irradiation with an actinic ray or radiation, wherein the component (A) has repeating units of at least one kind selected from the group consisting of vinyl ether repeating units containing groups represented by the following formula (A), vinyl ester repeating units containing groups represented by the following formula (A) and β-alkylacrylic acid repeating units containing groups represented by the following formula (A):

(A)

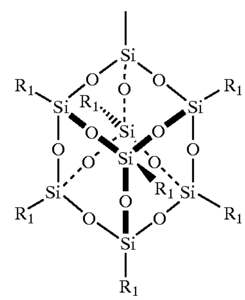

wherein each of $R_1$s individually represents a substituted or unsubstituted straight-chain, branched or cyclic alkyl group, and a plurality of $R_1$s may be the same or different.

2. The composition according to claim 1, wherein the vinyl ether repeating units are repeating units represented by the following formula (VA-1), (VA-2) or (VA-3):

(VA-1)

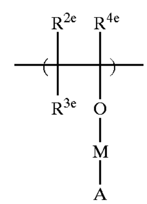

(VA-2)

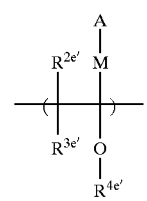

(VA-3)

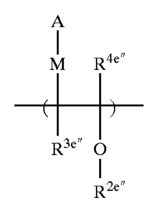

wherein $R^{2e}$, $R^{3e}$, $R^{2e'}$, $R^{3e'}$ and $R^{3e''}$ independently represent a hydrogen atom, an alkyl group or an alkoxy group, with the provided that both $R^{2e}$ and $R^{3e}$ do not represent alkoxy groups at the same time, and that both $R^{2e'}$ and $R^{3e'}$ do not represent alkoxy groups at the same time, $R^{4e'}$ and $R^{2e''}$ independently represent an alkyl group, $R^{4e}$ and $R^{4e''}$ independently represent a hydrogen atom or an alkyl group, M represents a divalent linkage group, and A is a group represented by formula (A), part of M and $R^{3e}$, $R^{2e}$ and $R^{4e}$, part of M and $R^{2e'}$, $R^{3e'}$ and $R^{4e'}$, part of M and $R^{4e''}$, or $R^{3e''}$ and $R^{2e''}$ may be combined with each other to form a ring.

3. The composition according to claim 1, wherein the vinyl ester repeating units are repeating units represented by the following formula (VB-1), (VB-2) or (VB-3):

(VB-1)

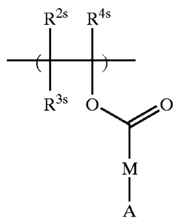

(VB-2)

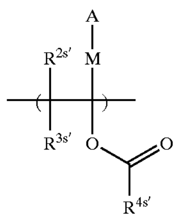

(VB-3)

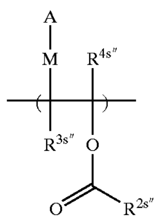

wherein $R^{2s}$, $R^{3s}$, $R^{4s}$, $R^{2s'}$, $R^{3s'}$, $R^{3s''}$ and $R^{4s''}$ independently represent a hydrogen atom or an alkyl group, $R^{4s'}$ and $R^{2s''}$ independently represent an alkyl group, M represents a divalent linkage group, and A is a group represented by formula (A), part of M and $R^{3s}$, $R^{2s}$ and $R^{4s}$, part of M and $R^{2s'}$, $R^{3s'}$ and $R^{4s'}$, part of M and $R^{4s''}$, or $R^{3s''}$ and $R^{2s''}$ may be combined with each other to form a ring.

4. The composition according to claim 1, wherein the β-alkylacrylic acid repeating units are repeating units represented by the following formula (AA-1), (AA-2) or (AA-3):

(AA-1)

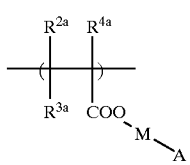

(AA-2)

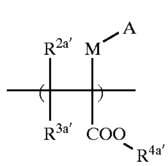

(AA-3)

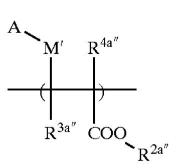

wherein $R^{2a}$, $R^{2a'}$, $R^{4a'}$ and $R^{2a''}$ independently represent an alkyl group, $R^{3a}$, $R^{4a}$, $R^{3a'}$, $R^{3a''}$ and $R^{4a''}$ independently represent a hydrogen atom or an alkyl group, M represents a divalent linkage group, M' represents a divalent linkage group attaching to the main chain via a carbon atom or a silicon atom, and A is a group represented by formula (A), wherein part of M and $R^{3a}$, $R^{2a}$ and $R^{4a}$, part of M and $R^{2a'}$, $R^{3a'}$ and $R^{4a'}$, part of M' and $R^{4a''}$, or $R^{3a''}$ and $R^{2a''}$ may be combined with each other to form a ring.

5. The composition according to claim 1, wherein the component (A) further comprises repeating units containing hydrophilic functional groups.

6. The composition according to claim 1, wherein the component (A) further comprises repeating units of at least one kind selected from repeating units represented by the following formula (2a) or repeating units represented by the following formula (2b):

(2a)

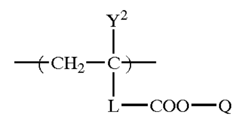

wherein $Y^2$ represents a hydrogen atom, an alkyl group, a cyano group or a halogen atom, L represents a single bond or a divalent linkage group, and Q represents a group decomposing by an acid and generating a carboxylic acid:

(2b)

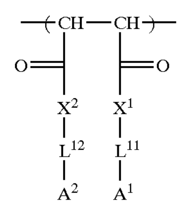

wherein $X^1$ and $X^2$ independently represent an oxygen atom, a sulfur atom, —NH— or —$NHSO_2$—, $L^{11}$ and $L^{12}$ independently represent a single bond or a divalent linkage group, $A^1$ and $A^2$ independently represent a hydrogen atom, a cyano group, a hydroxyl group, —COOH, —$COOR^{5c}$, —CO—NH—$R^{6c}$, an unsubstituted or substituted alkyl group, an alkoxy group or —COOQ, $R^{5c}$ and $R^{6c}$ each represents an unsubstituted or substituted alkyl group, and Q represents a group capable of decomposing by acid and generating a carboxylic acid.

7. The composition according to claim 1, further comprising (C) at least one kind of surfactant selected from fluorine-based and/or silicon-based surfactants or nonionic surfactants.

8. The composition according to claim 1, further comprising (D) an organic basic compound.

9. The composition according to claim 1, wherein the proportion of the repeating units having groups represented by formula (A) is from 3 to 90 mole % based on the total amount of the resin (A).

10. The composition according to claim 9, wherein the proportion of the repeating units having groups represented by formula (A) is from 5 to 70 mole % based on the total amount of the resin (A).

11. The composition according to claim 10, wherein the proportion of the repeating units having groups represented by formula (A) is from 10 to 60 mole % based on the total amount of the resin (A).

12. The composition according to claim 5, wherein the proportion of the repeating units having hydrophilic functional groups is from 1 to 70 mole % based on the total amount of the resin (A).

13. The composition according to claim 12, wherein the proportion of the repeating units having hydrophilic functional groups is from 5 to 60 mole % based on the total amount of the resin (A).

14. The composition according to claim 13, wherein the proportion of the repeating units having hydrophilic functional groups is from 10 to 50 mole % based on the total amount of the resin (A).

15. The composition according to claim 6, wherein the proportion of the repeating units of at least one kind selected from repeating units represented by the following formula (2a) or repeating units represented by the following formula (2b) is 5 to 50 mole % based on the total amount of the resin (A).

16. A method for forming a pattern, which comprises forming a resist film comprising the composition described in claim 1, exposing the resist film upon irradiation with the actinic ray or a radiation, and subsequently developing the resist film.

* * * * *